(12) United States Patent
Lee et al.

(10) Patent No.: US 11,569,457 B2
(45) Date of Patent: Jan. 31, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-Si (KR)

(72) Inventors: Jungsub Lee, Hwaseong-si (KR); Hyein Jeong, Suwon-si (KR); Hye Jeong Park, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 342 days.

(21) Appl. No.: 16/547,504

(22) Filed: Aug. 21, 2019

(65) Prior Publication Data

US 2020/0185605 A1 Jun. 11, 2020

(30) Foreign Application Priority Data

Dec. 5, 2018 (KR) .......................... 10-2018-0155179

(51) Int. Cl.
| | |
|---|---|
| *H01L 51/00* | (2006.01) |
| *C07F 5/02* | (2006.01) |
| *C09K 11/06* | (2006.01) |
| *H01L 51/50* | (2006.01) |

(52) U.S. Cl.
CPC ............ *H01L 51/008* (2013.01); *C07F 5/027* (2013.01); *C09K 11/06* (2013.01); *C09K 2211/1018* (2013.01); *H01L 51/0005* (2013.01); *H01L 51/5012* (2013.01); *H01L 51/5056* (2013.01); *H01L 51/5072* (2013.01); *H01L 2251/552* (2013.01)

(58) Field of Classification Search
CPC ........... H01L 51/008; C07F 5/027; C07F 5/02
See application file for complete search history.

(56) References Cited

U.S. PATENT DOCUMENTS

| | | | |
|---|---|---|---|
| 9,947,876 B2 | 4/2018 | Kawamura et al. | |
| 2008/0180024 A1* | 7/2008 | Kwon ................. | H01L 27/3244 313/504 |
| 2013/0059996 A1 | 3/2013 | Tovar et al. | |
| 2018/0114929 A1* | 4/2018 | Kwong ................. | C09K 11/02 |
| 2018/0175306 A1 | 6/2018 | Dyatkin et al. | |

FOREIGN PATENT DOCUMENTS

KR 10-2017-0083960 A 7/2017

\* cited by examiner

*Primary Examiner* — Alexander C Kollias
(74) *Attorney, Agent, or Firm* — Kile Park Reed & Houtteman PLLC

(57) ABSTRACT

An organic electroluminescence device of an embodiment includes a first electrode, a second electrode and a plurality of organic layers disposed between the first electrode and the second electrode, in which at least one of the organic layers includes a polycyclic compound including a plurality of electron donors and an electron acceptor connecting the electron donors, at least one of the electron donors is a condensed ring including a borepine core, and the electron acceptor includes a phenyl group including, as a substituent, at least one cyano group or a heterocycle including at least one nitrogen atom, or a heteroaryl group including an oxygen atom or a sulfur atom for forming a ring, thereby achieving improved emission efficiency.

20 Claims, 2 Drawing Sheets

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATIONS

This U.S. non-provisional patent application claims priority under 35 U.S.C. § 119 from Korean Patent Application No. 10-2018-0155179, filed on Dec. 5, 2018, the entire contents of which are hereby incorporated by reference.

BACKGROUND

The present disclosure herein relates to an organic electroluminescence device and a polycyclic compound used for the same.

Development of an organic electroluminescence display as an image display is being actively conducted. An organic electroluminescence display is different from a liquid crystal display in that it is a self-luminescent display that displays images by recombining holes and electrons injected from a first electrode and a second electrode in an emission layer. Light is emitted from a luminescent material including an organic compound in the emission layer.

In an application of an organic electroluminescence device to a display, decrease of a driving voltage, increase of emission efficiency and extension of life for the organic electroluminescence device are required, and development of materials which may reliably implement the requirements in the organic electroluminescence device is continuously required.

In particular, development of phosphorescence emission using triplet state energy or delayed fluorescence emission using triplet-triplet annihilation (TTA) in which singlet excitons are generated by the collision of triplet excitons is being conducted recently for achieving a high efficiency organic electroluminescence device. In addition, thermally activated delayed fluorescence (TADF) materials using delayed fluorescence phenomenon are being developed.

SUMMARY

The present disclosure provides an organic electroluminescence device with improved emission efficiency and device life.

The present disclosure also provides a polycyclic compound which may improve emission efficiency and life of an organic electroluminescence device.

An embodiment of the inventive concept provides a polycyclic compound represented by the following Formula 1.

[DU1┤―┤AU┤―┤DU2]$_m$        [Formula 1]

In Formula 1, DU1 and DU2 are represented by the following Formula 2-1 or 2-2, and at least one of DU1 or DU2 is represented by the following Formula 2-1, AU is represented by the following Formula 3-1 or 3-2, and m is 1 or 2.

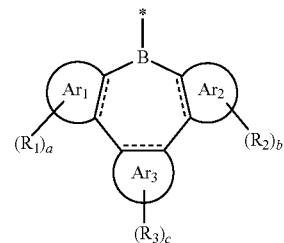

[Formula 2-1]

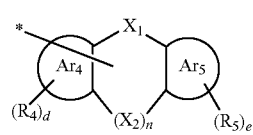

[Formula 2-2]

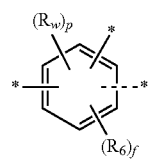

[Formula 3-1]

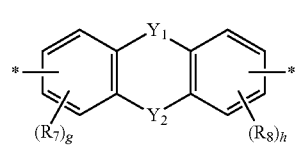

[Formula 3-2]

In Formula 2-2, $X_1$ is N, or $NR_a$, $X_2$ is a direct linkage, $CR_bR_c$, or $(CR_d)=(CR_e)$, and n is 1 to 2.

In Formulae 2-1 and 2-2, $Ar_1$ to $Ar_5$ are each independently a hydrocarbon ring having 5 to 60 carbon atoms for forming a ring, or a heterocycle having 5 to 60 carbon atoms for forming a ring which includes no nitrogen atom for forming a ring, and a to e are each independently an integer of 0 to 4.

In Formula 3-1, $R_w$ is a cyano group, or a substituted or unsubstituted heterocycle having 2 to 60 carbon atoms for forming a ring which includes at least one nitrogen atom for forming a ring, p is an integer of 1 to 3, and f is an integer of 0 to 3.

In Formula 3-2, $Y_1$ is O, S, or $SO_2$, $Y_2$ is a direct linkage or $CR_fR_g$, and g and h are each independently an integer of 0 to 3.

In Formulae 2-1, 2-2, 3-1, and 3-2, $R_1$ to $R_8$, and $R_a$ to $R_g$ are each independently a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring.

In an embodiment, Formula 1 may be represented by the following Formula 1-1.

[Formula 1-1]

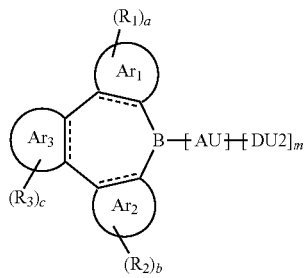

In Formula 1-1, AU, DU2, and m are the same as defined in Formula 1, and $Ar_1$ to $Ar_3$, $R_1$ to $R_3$, and a to c are the same as defined in Formula 2-1.

In an embodiment, DU2 may be represented by any one of the following D1 to D3.

D1

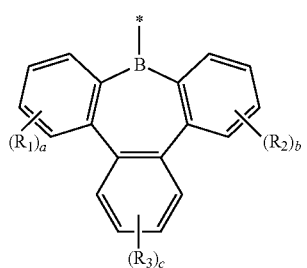

D2

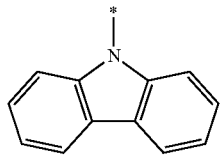

D3

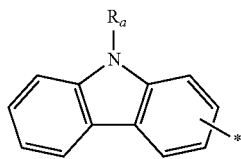

In D1 to D3, $R_1$ to $R_3$, a to c, and $R_a$ are the same as defined in Formulae 2-1 and 2-2.

In an embodiment, Formula 2-1 may be represented by the following Formula 2-1A.

[Formula 2-1A]

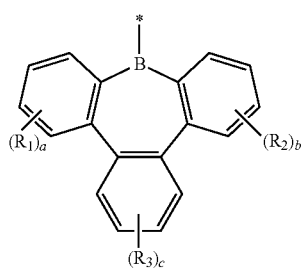

In Formula 2-1A, $R_1$ to $R_3$, and a to c are the same as defined in Formula 2-1.

In an embodiment, Formula 2-2 may be represented by the following Formula 2-2A or 2-2B.

[Formula 2-2A]

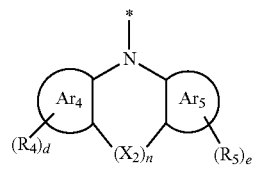

[Formula 2-2B]

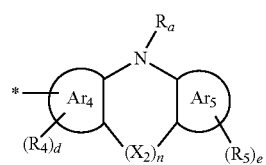

In Formulae 2-2A and 2-2B, $Ar_4$, $Ar_5$, $R_4$, $R_5$, d, e, $X_2$, n, and $R_a$ are the same as defined in Formula 2-2.

In an embodiment, AU may be represented by any one of the following A1 to A7.

A1

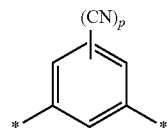

A2

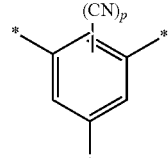

A3

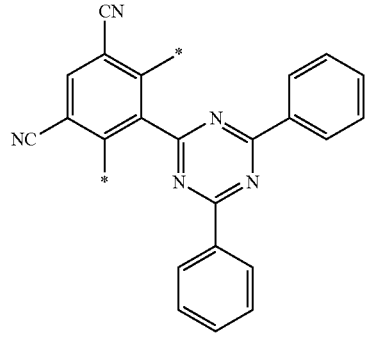

A4

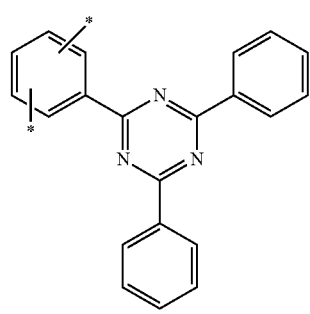

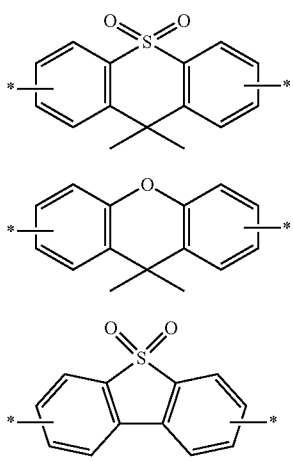

In A1 and A2, p is an integer of 1 to 3.

In an embodiment, $Ar_1$ to $Ar_3$ may be a substituted or unsubstituted benzene ring.

In an embodiment, $R_W$ may be a cyano group or a substituted or unsubstituted triazine group.

In an embodiment of the inventive concept, an organic electroluminescence device includes a first electrode; a second electrode disposed on the first electrode; and a plurality of organic layers disposed between the first electrode and the second electrode, in which at least one of the organic layers includes a polycyclic compound including a plurality of electron donors and an electron acceptor connecting the electron donors, at least one of the electron donors is a condensed ring including a borepine core, and the electron acceptor includes a phenyl group including, as a substituent, at least one cyano group or a heterocycle including at least one nitrogen atom, or a heteroaryl group including an oxygen atom or a sulfur atom for forming a ring. The first electrode and the second electrode may each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof.

In an embodiment, the organic layers may include a hole transport region; an emission layer disposed on the hole transport region; and an electron transport region disposed on the emission layer, and the emission layer may include the polycyclic compound.

In an embodiment, the emission layer may emit a delayed fluorescence.

In an embodiment, the emission layer may be a delayed fluorescence emission layer including a host and a dopant, and the dopant may include the polycyclic compound.

In an embodiment, the emission layer may emit blue light.

In an embodiment, at least one of the electron donors may include a substituted or unsubstituted tribenzoborepine.

In an embodiment, the electron acceptor may be a phenyl group including at least one cyano group as a substituent, a phenyl group including a substituted or unsubstituted triazine group as a substituent, a substituted or unsubstituted xanthene group, a substituted or unsubstituted thioxanthene group, a substituted or unsubstituted dibenzothiophene dioxide group, or a substituted or unsubstituted thioxanthene dioxide group.

In an embodiment, the organic layers may be provided by an inkjet process.

In an embodiment, the polycyclic compound may be represented by Formula 1.

In an embodiment of the inventive concept, an organic electroluminescence device includes a first electrode; a hole transport region disposed on the first electrode; an emission layer disposed on the hole transport region, the emission layer including the polycyclic compound represented by Formula 1; an electron transport region disposed on the emission layer; and a second electrode disposed on the electron transport region. The first electrode and the second electrode may each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
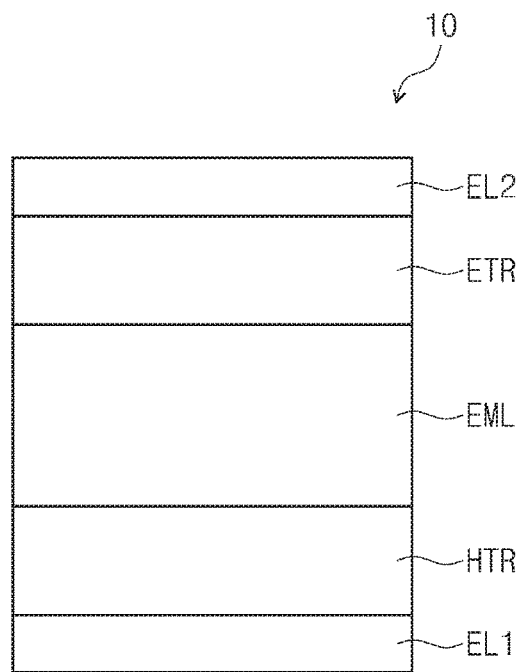
FIG. 1 is a schematic cross-sectional view of an organic electroluminescence device according to an embodiment of the inventive concept.

The inventive concept may have various modifications and may be embodied in different forms, and example embodiments will be explained in detail with reference to the accompanying drawings. However, the inventive concept should not be construed as limited to the embodiments set forth herein. Rather, it should be understood that the scope of the inventive concept includes all modification, equivalents and alternatives within the spirit and scope of the inventive concept as hereinafter claimed.

In the present disclosure, it will be understood that when an element (or region, layer, part, etc.) is referred to as being "on", "connected to" or "coupled to" another element, it can be directly on/connected/coupled to the other element or intervening elements may be present.

Like reference numerals refer to like elements for explaining each drawing. In the drawings, the thickness, the ratio and the dimension of the element are exaggerated for effective description of the technical contents.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another element. For example, a first element discussed below could be termed a second element, and similarly, a second element could be termed a first element. As used herein, the singular forms are intended to include the plural forms as well, unless the context clearly indicates otherwise.

Spatially relative terms, such as "beneath", "below", "above", "upper" and the like, are used herein to describe one element or feature's relationship to another element(s) or feature(s) as illustrated in the figures. It will be understood that the spatially relative terms are a relative concept to describe based on the orientation depicted in the figures.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that the terms "comprise" or "have," when used in this specification, specify the presence of stated features, numerals, steps, operations, elements, parts, or a combination thereof, but do not preclude the presence or addition of one or more other features, numerals, steps, operations, elements, parts, or a combination thereof.

Hereinafter, an organic electroluminescence device according to an embodiment of the inventive concept and a polycyclic compound according to an embodiment of the inventive concept included therein will be explained referring to the accompanying drawings.

Figure 2:
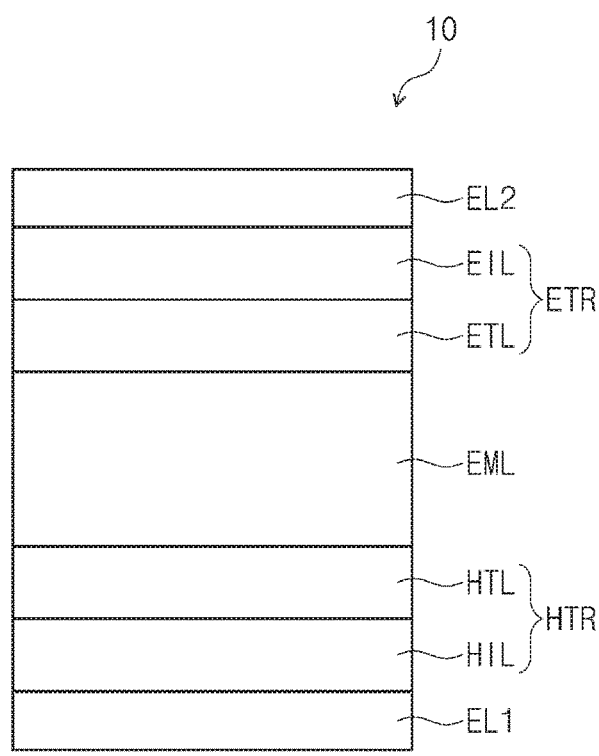
FIG. 2 is a schematic cross-sectional view of an organic electroluminescence device according to an embodiment of the inventive concept.
Figure 3:
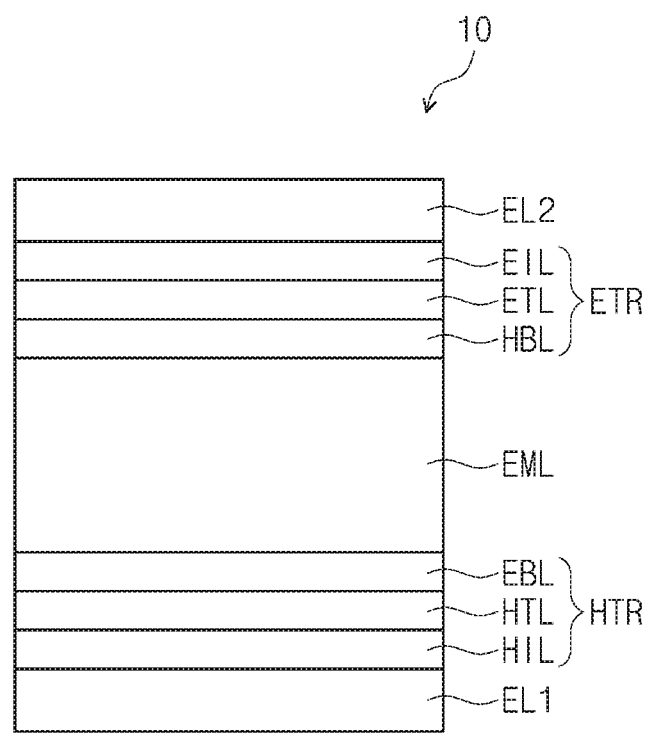
FIG. 3 is a schematic cross-sectional view of an organic electroluminescence device according to an embodiment of the inventive concept.

Each of FIGS. 1 to 3 is a schematic cross-sectional view illustrating an organic electroluminescence device according to an embodiment of the inventive concept. Referring to FIGS. 1 to 3, in the organic electroluminescence device 10 of an embodiment, the first electrode EL1 and the second electrode EL2 are disposed oppositely, and a plurality of organic layers may be disposed between the first electrode EL1 and the second electrode EL2. The plurality of organic layers may include a hole transport region HTR, an emission layer EML and an electron transport region ETR. That is, the organic electroluminescence device 10 of an embodiment may include a first electrode EL1, a hole transport region HTR, an emission layer EML, an electron transport region ETR, and a second electrode EL2, laminated in order. Meanwhile, at least one of the plurality of organic layers may be provided by an inkjet process. For example, the organic layers of a hole transport region HTR, an emission layer EML, and an electron transport region ETR, etc. may be formed by an inkjet process.

The organic electroluminescence device 10 according to an embodiment of the inventive concept may include a polycyclic compound according to an embodiment of the inventive concept in at least one of the plurality of organic layers disposed between the first electrode EL1 and the second electrode EL2. For example, the organic electroluminescence device 10 of an embodiment may include the polycyclic compound of an embodiment in at least one organic layer of the hole transport region HTR, the emission layer EML, and the electron transport region ETR. Specifically, the organic electroluminescence device 10 of an embodiment may include the polycyclic compound of an embodiment in the emission layer EML as a luminescent material.

FIG. 2 shows a schematic cross-sectional view illustrating an organic electroluminescence device 10 according to an embodiment of the inventive concept, in which a hole transport region HTR includes a hole injection layer HIL and a hole transport layer HTL, and an electron transport region ETR includes an electron injection layer EIL and an electron transport layer ETL. Furthermore, comparing with FIG. 1, FIG. 3 shows a schematic cross-sectional view illustrating an organic electroluminescence device 10 according to an embodiment of the inventive concept, in which a hole transport region HTR includes a hole injection layer HIL, a hole transport layer HTL and an electron blocking layer EBL, and an electron transport region ETR includes an electron injection layer EIL, an electron transport layer ETL and a hole blocking layer HBL.

The first electrode EL1 has conductivity. The first electrode EL1 may be formed by a metal alloy or a conductive compound. The first electrode EL1 may be an anode. The first electrode EL1 may also be a pixel electrode. The first electrode EL1 may be a transmissive electrode, a transflective electrode, or a reflective electrode. In case the first electrode EL1 is the transmissive electrode, the first electrode EL1 may include a transparent metal oxide such as indium tin oxide (ITO), indium zinc oxide (IZO), zinc oxide (ZnO), or indium tin zinc oxide (ITZO). In case the first electrode EL1 is the transflective electrode or reflective electrode, the first electrode EL1 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). Also, the first electrode EL1 may have a structure including a plurality of layers including a reflective layer or transflective layer formed using the above materials, and a transparent conductive layer formed using ITO, IZO, ZnO, or ITZO. For example, the first electrode EL1 may have a triple-layer structure of ITO/Ag/ITO. However, an embodiment of the inventive concept is not limited thereto. The thickness of the first electrode EL1 may be from about 1,000 Å to about 10,000 Å, for example, from about 1,000 Å to about 3,000 Å.

The hole transport region HTR is disposed on the first electrode EL1. The hole transport region HTR may include at least one of a hole injection layer HIL, a hole transport layer HTL, a hole buffer layer (not shown), or an electron blocking layer EBL. The thickness of the hole transport region HTR may be, for example, from about 50 Å to about 15,000 Å.

The hole transport region HTR may have a single layer formed using a single material, a single layer formed using a plurality of different materials, or a multilayer structure including a plurality of layers formed using a plurality of different materials.

For example, the hole transport region HTR may have a single layer structure of a hole injection layer HIL or a hole transport layer HTL, or may have a single layer structure formed using a hole injection material and a hole transport material. In addition, the hole transport region HTR may have a single layer structure formed using a plurality of different materials, or a laminated structure of hole injection layer HIL/hole transport layer HTL, hole injection layer HIL/hole transport layer HTL/hole buffer layer (not shown), hole injection layer HIL/hole buffer layer (not shown), hole transport layer HTL/hole buffer layer, or hole injection layer HIL/hole transport layer HTL/electron blocking layer EBL, laminated in order from the first electrode EL1, without limitation.

The hole transport region HTR may be formed using various methods such as a vacuum deposition method, a spin coating method, a cast method, a Langmuir-Blodgett (LB) method, an inkjet printing method, a laser printing method, and a laser induced thermal imaging (LITI) method.

The hole injection layer HIL may include, for example, a phthalocyanine compound such as copper phthalocyanine; N,N'-diphenyl-N,N'-bis-[4-(phenyl-m-tolyl-amino)-phenyl]-biphenyl-4,4'-diamine (DNTPD), 4,4',4"-tris(3-methylphenylphenylamino)triphenylamine (m-MTDATA), 4,4', 4"-tris(N,N-diphenylamino)triphenylamine (TDATA), 4,4', 4"-tris{N-(2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalen-1-yl)-N,N'-diphenyl-benzidine (NPB), triphenylamine-containing polyether ketone (TPAPEK), 4-isopropyl-4'-methyldiphenyliodonium tetrakis(pentafluorophenyl)borate, dipyrazino[2,3-f: 2',3'-h] quinoxaline-2,3,6,7,10,11-hexacarbonitrile (HAT-CN), etc.

The hole transport layer HTL may further include carbazole derivatives such as N-phenyl carbazole, polyvinyl carbazole, fluorene-based derivatives, N,N'-bis(3-methylphenyl)-N,N'-diphenyl-[1,1-biphenyl]-4,4'-diamine (TPD), triphenylamine-based derivatives such as 4,4',4"-tris(N-carbazolyl)triphenylamine (TCTA), N,N'-di(naphthalen-1-yl)-N,N'-diphenyl-benzidine (NPB), 4,4'-cyclohexylidene bis [N,N-bis(4-methylphenyl)benzenamine](TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 10 Å to about 1,000 Å. For example, the thickness of the electron blocking layer EBL may be from about 10 Å to about 1,000 Å. In case the thicknesses of the hole transport region HTR, the hole injection layer HIL, the hole transport layer HTL and the electron blocking layer EBL satisfy the above-described ranges, satisfactory hole transport properties may be obtained without substantial increase of a driving voltage.

The hole transport region HTR may further include a charge generating material in addition to the above-described materials to improve conductivity. The charge generating material may be dispersed in the hole transport region HTR uniformly or non-uniformly. The charge generating material may be, for example, a p-dopant. The p-dopant may be one of quinone derivatives, metal oxides, or cyano group-containing compounds, without limitation. For example, non-limiting examples of the p-dopant may include quinone derivatives such as tetracyanoquinodimethane (TCNQ), and 2,3,5,6-tetrafluoro-7,7,8,8-tetracyanoquinodimethane (F4-TCNQ), metal oxides such as tungsten oxide and molybdenum oxide, without limitation.

As described above, the hole transport region HTR may further include at least one of a hole buffer layer (not shown) or an electron blocking layer EBL in addition to the hole injection layer HIL and the hole transport layer HTL. The hole buffer layer (not shown) may compensate an optical resonance distance according to the wavelength of light emitted from the emission layer EML and increase light emission efficiency. Materials included in the hole transport region HTR may be used as materials included in the hole buffer layer (not shown). The electron blocking layer EBL is a layer preventing electron injection from the electron transport region ETR into the hole transport region HTR.

The emission layer EML is disposed on the hole transport region HTR. The thickness of the emission layer EML may be, for example, from about 100 Å to about 1,000 Å, or from about 100 Å to about 300 Å. The emission layer EML may have a single layer formed using a single material, a single layer formed using a plurality of different materials, or a multilayer structure having a plurality of layers formed using a plurality of different materials.

In the organic electroluminescence device 10 according to an embodiment of the inventive concept, the emission layer EML may include a polycyclic compound according to an embodiment of the inventive concept.

The polycyclic compound according to an embodiment of the inventive concept may include a plurality of electron donors and an electron acceptor disposed between the electron donors. The electron acceptor may connect the electron donors with each other. The electron acceptor may be combined with a plurality of electron donors. For example, the polycyclic compound of an embodiment may include two electron donors and one electron acceptor, or include three electron donors and one electron acceptor.

In the polycyclic compound of an embodiment, at least one of the electron donors may be a condensed ring including a borepine core. At least one of the electron donors may be a condensed ring including a borepine core and three hydrocarbon rings or heterocycles condensed to the borepine core. Meanwhile, the heterocycle condensed to the borepine core includes no nitrogen atom. Specifically, at least one of the electron donors in the polycyclic compound of an embodiment may include a substituted or unsubstituted tribenzoborepine.

In the polycyclic compound of an embodiment, the electron donors may include a heteroaryl group including a nitrogen atom in addition to the condensed ring including a borepine core. For example, the electron donors of the polycyclic compound may include a substituted or unsubstituted carbazole group.

In the polycyclic compound of an embodiment, the electron acceptor may be a phenyl group including, as a substituent, at least one cyano group or a heterocycle including at least one nitrogen atom. Alternatively, the electron acceptor in the polycyclic compound of an embodiment may be a heteroaryl group including an oxygen atom or a sulfur atom for forming a ring.

In the polycyclic compound of an embodiment, the electron acceptor may be a phenyl group including at least one cyano group as a substituent, a phenyl group including a substituted or unsubstituted triazine group as a substituent, a substituted or unsubstituted xanthene group, a substituted or unsubstituted thioxanthene group, a substituted or unsubstituted dibenzothiophene dioxide group, or a substituted or unsubstituted thioxanthene dioxide group.

For example, the electron acceptor may be a phenyl group substituted with two cyano groups, a phenyl group substituted with three cyano groups, a phenyl group substituted with diphenyltriazine group, a phenyl group substituted with both a cyano group and a diphenyltriazine group, a dimethyl xanthene group, a dibenzothiophene dioxide group, or a dimethylthioxanthene dioxide group. However, an embodiment of the inventive concept is not limited thereto.

In the present disclosure, "substituted or unsubstituted" may mean unsubstituted or substituted with at least one substituent selected from the group consisting of deuterium, halogen, cyano, nitro, amino, silyl, oxy, thio, sulfinyl, sulfonyl, carbonyl, boron, phosphine oxide, phosphine sulfide, alkyl, alkenyl, alkoxy, hydrocarbon ring, aryl and heterocyclic group. In addition, each of the substituent illustrated above may be substituted or unsubstituted. For example, biphenyl may be interpreted as aryl, or phenyl substituted with phenyl.

In the present disclosure, examples of a halogen atom are a fluorine atom, a chlorine atom, a bromine atom, or an iodine atom.

In the present disclosure, the alkyl group may have a linear, branched or cyclic form. The carbon number of the alkyl group may be 1 to 50, 1 to 30, 1 to 20, 1 to 10, or 1 to 6. Examples of the alkyl group may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldodecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyl eicosyl, 2-butyl eicosyl, 2-hexyl eicosyl, 2-octyl eicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the present disclosure, the hydrocarbon ring includes an aliphatic hydrocarbon ring and an aromatic hydrocarbon ring. The heterocycle includes an aliphatic heterocycle and an aromatic heterocycle. The hydrocarbon ring and heterocycle may be a monocycle or a polycycle.

In the present disclosure, the hydrocarbon ring may be any functional group or substituent derived from an aliphatic hydrocarbon ring, or any functional group or substituent derived from an aromatic hydrocarbon ring. The carbon number of the hydrocarbon ring for forming a ring may be 5 to 60.

In the present disclosure, the heterocycle may be any functional group or substituent derived from heterocycle including at least one heteroatom for forming a ring. The carbon number of the heterocycle for forming a ring may be 5 to 60.

In the present disclosure, the aryl group means any functional group or substituent derived from an aromatic hydrocarbon ring. The aryl group may be monocyclic aryl or polycyclic aryl. The carbon number of the aryl group for forming a ring may be 6 to 30, 6 to 20, or 6 to 15. Examples of the aryl group may include phenyl, naphthyl, fluorenyl, anthracenyl, phenanthryl, biphenyl, terphenyl, quaterphenyl, quinqphenyl, sexiphenyl, triphenylenyl, pyrenyl, benzofluoranthenyl, chrysenyl, etc., without limitation.

In the present disclosure, the fluorenyl group may be substituted, and two substituents may be combined with each other to form a spiro structure. Examples of the substituted fluorenyl group may include the following groups, without limitation.

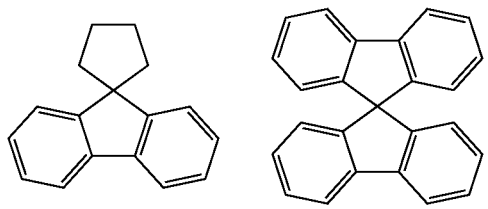

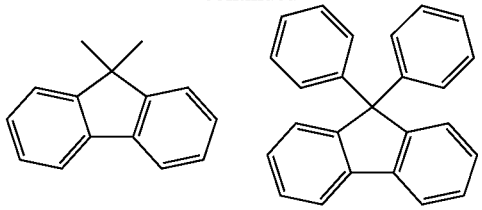

In the present disclosure, the heteroaryl group may be heteroaryl including at least one of B, O, N, P, Si, or S as a heteroatom. When the heteroaryl group includes two or more heteroatoms, these heteroatoms may be the same or different from each other. The heteroaryl group may be monocyclic heterocycle or polycyclic heterocycle. The carbon number of the heteroaryl group for forming a ring may be 2 to 30, 2 to 20, or 2 to 10. Examples of the heteroaryl group may include thiophene, furan, pyrrole, imidazole, thiazole, oxazole, oxadiazole, triazole, pyridine, bipyridine, pyrimidine, triazine, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-aryl carbazole, N-heteroaryl carbazole, N-alkyl carbazole, benzoxazole, benzoimidazole, benzothiazole, benzocarbazole, benzothiophene, dibenzothiophene, thienothiophene, benzofuran, phenanthroline, thiazole, isoxazole, thiadiazole, phenothiazine, dibenzosilole, dibenzofuran, etc., without limitation.

In the present disclosure, the above explanation on the aryl group may be applied to the arylene group, except that the arylene group is divalent. The above explanation on the heteroaryl group may be applied to the heteroarylene group, except that the heteroarylene group is divalent.

In the present disclosure, the silyl group includes alkyl silyl and aryl silyl. Examples of the silyl group may include trimethylsilyl, triethylsilyl, t-butyl dimethylsilyl, vinyl dimethylsilyl, propyl dimethylsilyl, triphenylsilyl, diphenylsilyl, phenylsilyl, etc., without limitation.

In the present disclosure, the carbon number of the amino group is not specifically limited, and may be 1 to 30. The amino group may include alkyl amino and aryl amino. Examples of the amino group include methylamino, dimethylamino, phenylamino, diphenylamino, naphthylamino, 9-methyl-anthracenylamino, triphenylamino, etc., without limitation.

In the present disclosure, ▬*means a position to be connected. Meanwhile, in the present disclosure, ---* means a position to be connected, which is optionally employed or deleted depending on the number of binding sites.

Meanwhile, in the present disclosure, a dotted line (----) indicates a position to which a double bond is optionally applied. That is, a position represented by a dotted line (----) may be a position of double bond or a single bond.

The polycyclic compound of an embodiment included in the organic electroluminescence device 10 of an embodiment may be represented by the following Formula 1.

 [Formula 1]

In Formula 1, DU1 and DU2 may be an electron donor, and AU may be an electron acceptor. In Formula 1, m may be 1 or 2. That is, the polycyclic compound represented by Formula 1 may include two or more electron donors and an electron acceptor disposed between the electron donors.

In Formula 1, DU1 and DU2 may be the same or different from each other. In case m is 2, two moieties represented by DU2 may be the same or different from each other.

In Formula 1, DU1 and DU2 may be represented by the following Formula 2-1 or 2-2. In addition, at least one of DU1 or DU2 may be represented by the following Formula 2-1.

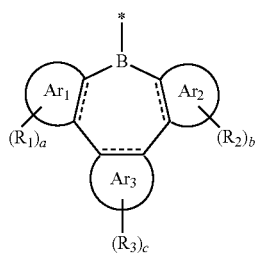

[Formula 2-1]

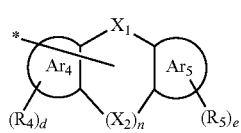

[Formula 2-2]

In Formulae 2-1 and 2-2, $A_1$ to $Ar_5$ may be each independently a hydrocarbon ring having 5 to 60 carbon atoms for forming a ring, or a heterocycle having 5 to 60 carbon atoms for forming a ring which includes no nitrogen atom for forming a ring.

In Formulae 2-1 and 2-2, $R_1$ to $R_5$ may be each independently a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring.

In Formulae 2-1 and 2-2, a, b, c, d, and e may be each independently an integer of 0 to 4. In case a, b, c, d, or e is an integer of 2 or more, each of $R_1$, a plurality of $R_2$, a plurality of $R_3$, a plurality of $R_4$, and a plurality of $R_5$ may be the same or different from each otehr.

Formula 2-1 shows a condensed ring including a borepine core

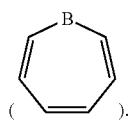

In Formula 2-1, $Ar_1$ to $Ar_3$ may be the same or different from each other. For example, in Formula 2-1, $Ar_1$ to $Ar_3$ may be the same. Specifically, in Formula 2-1, $Ar_1$ to $Ar_3$ may be a substituted or unsubstituted benzene ring. For example, Formula 2-1 may be a substituted or unsubstituted tribenzoborepine.

For example, Formula 2-1 may be represented by the following Formula 2-1A.

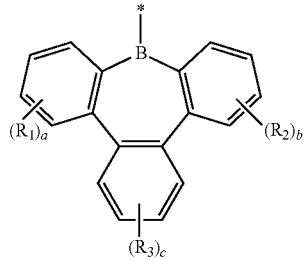

[Formula 2-1A]

In Formula 2-1A, the same explanation referring to Formula 2-1 may be applied to $R_1$ to $R_3$, and a to c.

In Formula 2-2, $X_1$ may be N, or $NR_a$, and $X_2$ may be a direct linkage, $CR_bR_c$, or $(CR_d)=(CR_e)$. In addition, n may be 1 to 2.

In Formula 2-2, $Ar_4$ and $Ar_5$ may be the same or different from each other. For example, in Formula 2-2, $Ar_4$ and $Ar_5$ may be the same. Specifically, in Formula 2-2, $Ar_4$ and $Ar_5$ may be a substituted or unsubstituted benzene ring.

In Formula 2-2, $X_1$ may be N, or $NR_a$.

In Formula 2-2, $R_a$ to $R_e$ may be each independently a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring. For example, In Formula 2-2, $R_a$ may be an unsubstituted phenyl group.

For example, Formula 2-2 may be represented by the following Formula 2-2A or 2-2B. Formula 2-2A is different from Formula 2-2B in the position to which an electron acceptor AU is connected.

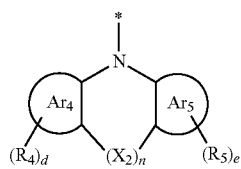

[Formula 2-2A]

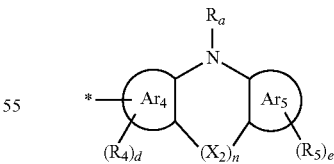

[Formula 2-2B]

In Formulae 2-2A and 2-2B, the same explanation referring to Formula 2-2 may be applied to $Ar_4$, $Ar_5$, $R_4$, $R_5$, d, e, $X_2$, n, and $R_a$.

In Formula 2-2, $X_1$ may be N, or $NR_a$, $X_2$ may be a direct linkage, and $Ar_4$ and $Ar_5$ may be a substituted or unsubstituted benzene ring. Specifically, Formula 2-2 may be a substituted or unsubstituted carbazole group. For example, Formula 2-2 may be represented by the following D2 or D3.

In D3, the same explanation referring to Formula 2-2 may be applied to $R_a$.

In Formula 1, AU may be represented by the following Formula 3-1 or 3-2.

[Formula 3-1]

[Formula 3-2]

In Formula 3-1, $R_W$ may be a cyano group, or a substituted or unsubstituted heterocycle having 2 to 60 carbon atoms for forming a ring which includes at least one nitrogen atom for forming a ring. For example, $R_W$ may be a cyano group, or a substituted or unsubstituted triazine group.

In Formula 3-1, p may be an integer of 1 to 3. In Formula 3-1, when p is an integer of 2 or more, the plurality of $R_W$ may include the same $R_w$ or at least one may be different from each other.

In Formula 3-1, f may be an integer of 0 to 3. When f is an integer of 2 or more, the plurality of $R_6$ may include the same $R_6$ or at least one may be different from each other.

In Formula 3-2, $Y_1$ may be O, S, or $SO_2$. That is, Formula 3-2 may be a heteroarylene group including an oxygen atom or a sulfur atom for forming a ring.

In Formula 3-2, $Y_2$ may be a direct linkage or $CR_fR_g$, and g and h may be each independently an integer of 0 to 3. In Formula 3-2, when each of g and h is an integer of 2 or more, each of a plurality of $R_7$ and a plurality of $R_8$ may be the same or at least one may be different from each other.

In Formulae 3-1 and 3-2, each of $R_6$ to $R_8$, $R_f$ and $R_g$ may independently be a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring.

Meanwhile, Formula 3-1 may be represented by the following Formula 3-1A or 3-1B. Formula 3-1A represents a divalent phenyl group, and Formula 3-1B represents a trivalent phenyl group. For example, an electron acceptor AU represented by Formula 3-1A may combine with two electron donors, and an electron acceptor AU represented by Formula 3-1B may combine with three electron donors.

[Formula 3-1A]

[Formula 3-1B]

Formula 1 may be represented by the following Formula 1-1. That is, the polycyclic compound of an embodiment may include a condensed ring having a borepine core as an electron donor.

[Formula 1-1]

In Formula 1-1, the same explanation referring to Formula 1 may be applied to AU, DU2, and m. Furthermore, the same explanation referring to Formula 2-1 may be applied to $Ar_1$ to $Ar_3$, $R_1$ to $R_3$, and a to c.

In Formula 1-1, DU2 may be represented by any one of the following D1 to D3.

D1

D2

17

-continued

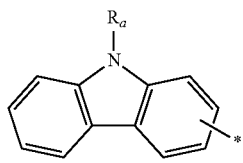
D3

In D1, the same explanation referring to Formula 2-1 may be applied to $R_1$ to $R_3$, and a to c, and the same explanation referring to Formula 2-2 may be applied to $R_a$ in D3.

In Formula 1-1, AU may be represented by any one of the following A1 to A7.

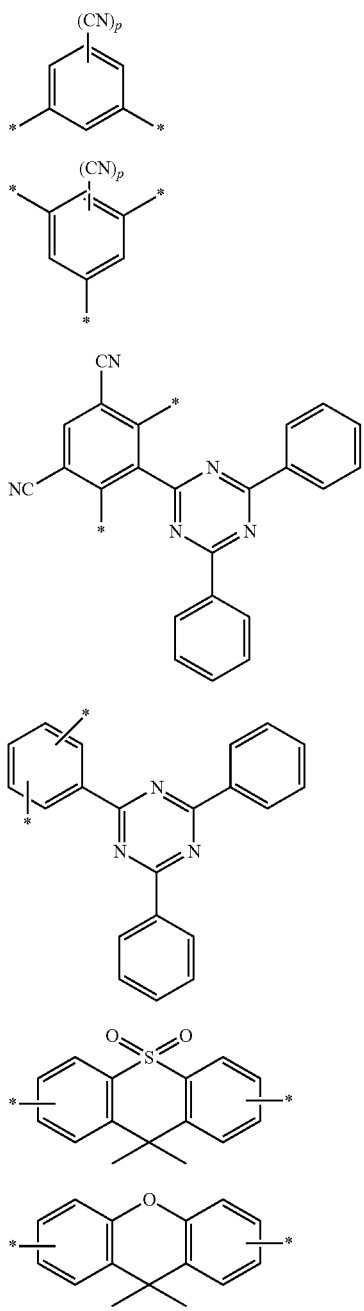

A1

A2

A3

A4

A5

A6

18

-continued

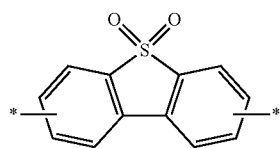
A7

In A1 and A2, p may be an integer of 1 to 3.

The polycyclic compound according to an embodiment of the inventive concept may be any one of compounds represented in the following Compound Group 1.

[Compound Group 1]

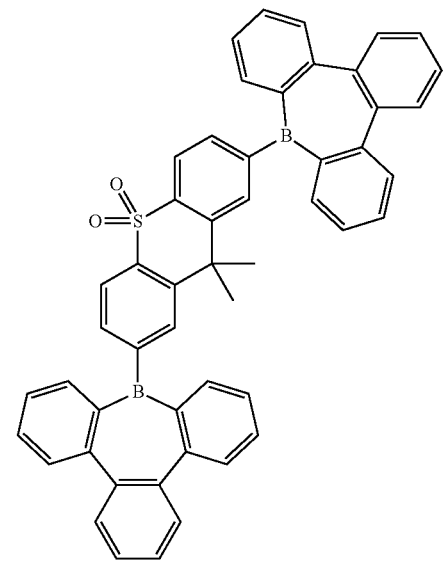
1

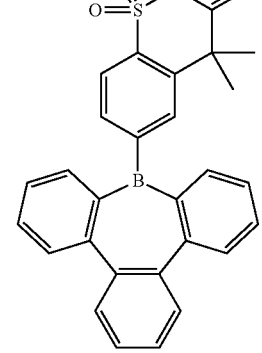

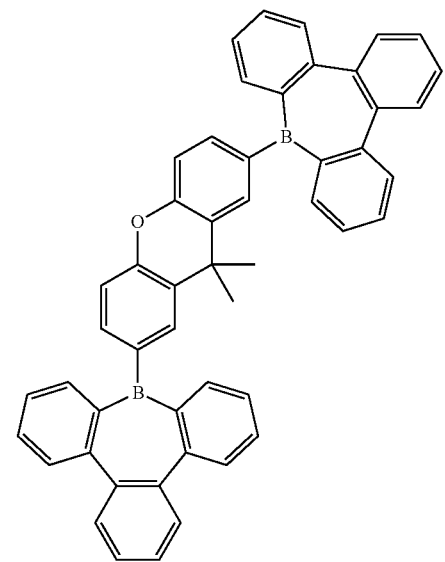
2

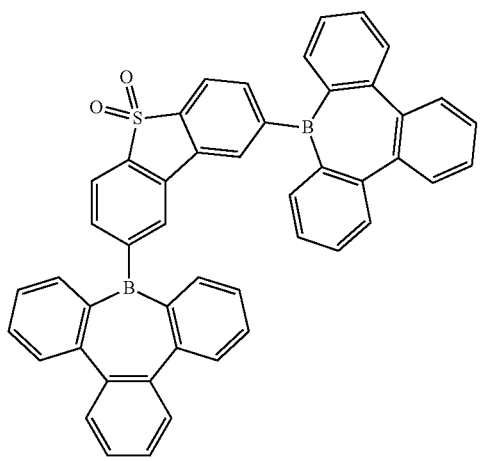
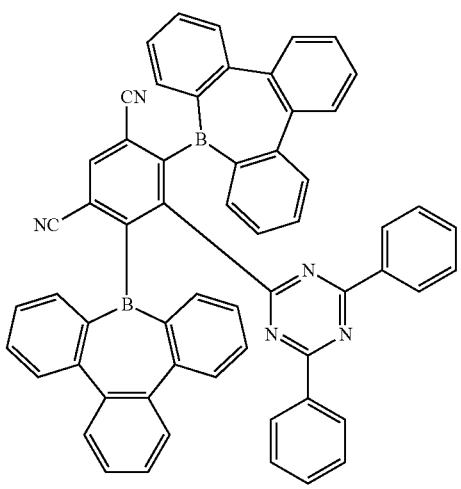
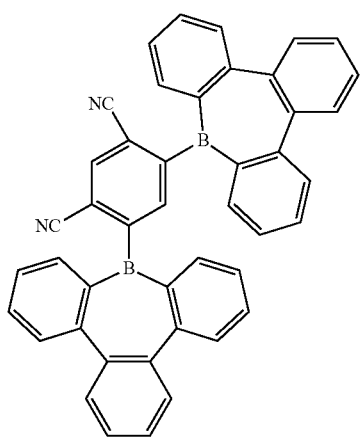
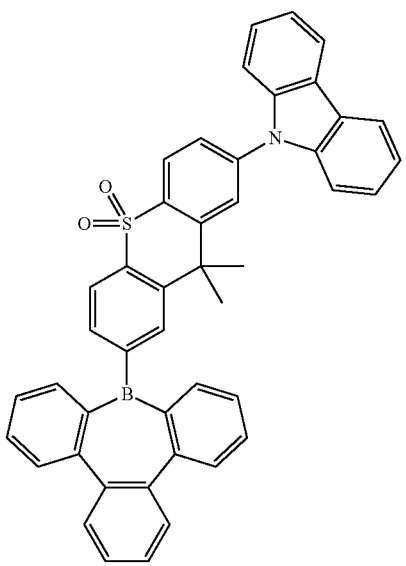
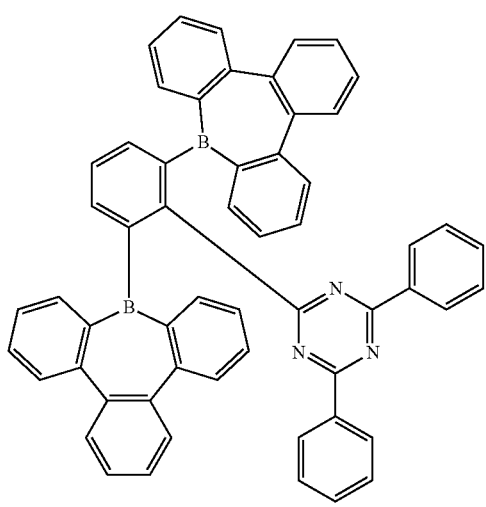
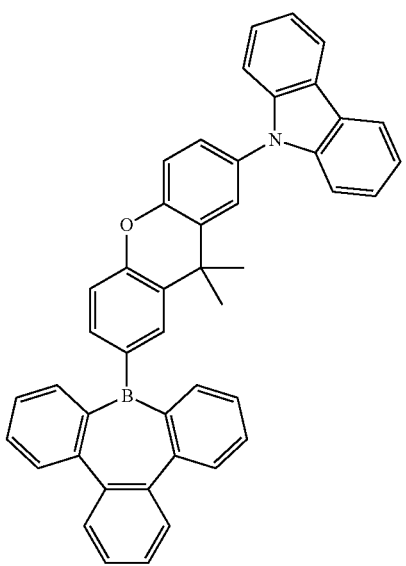

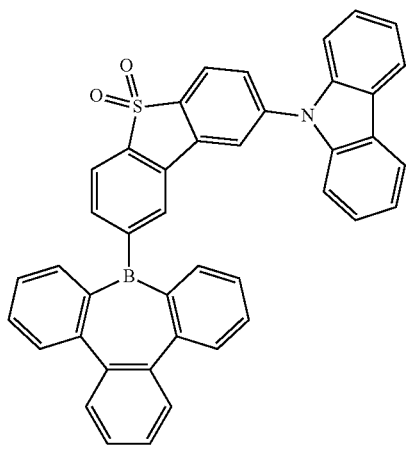
9
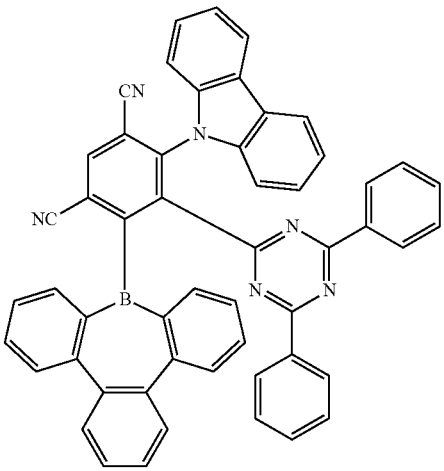
12
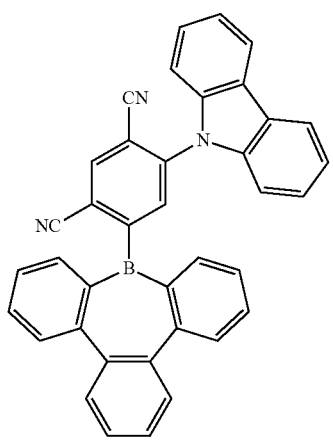
10
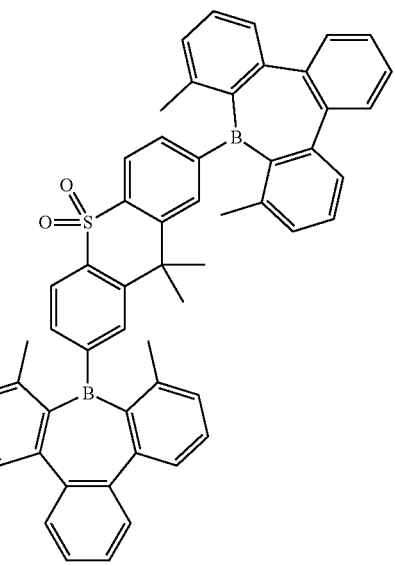
13
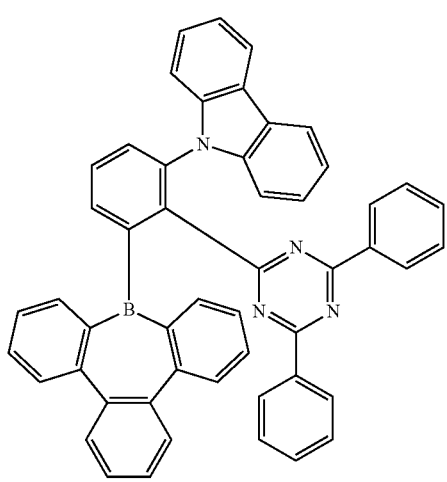
11
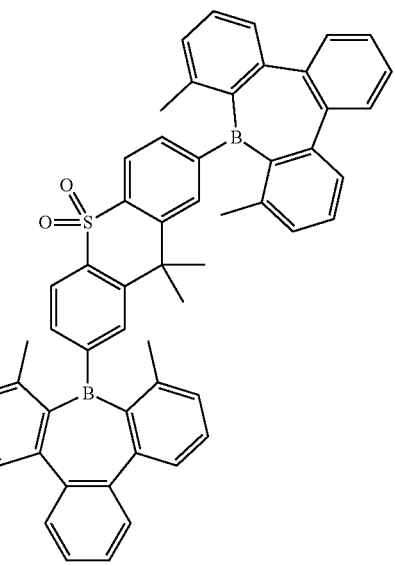
14

15
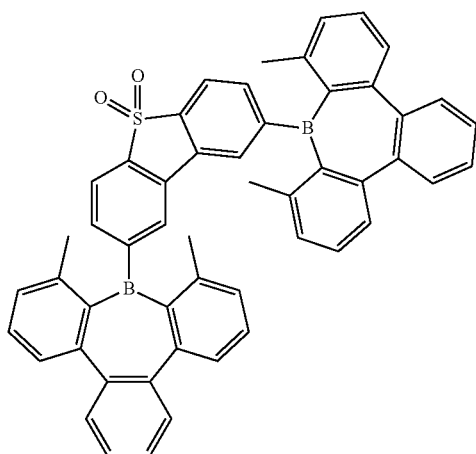
16
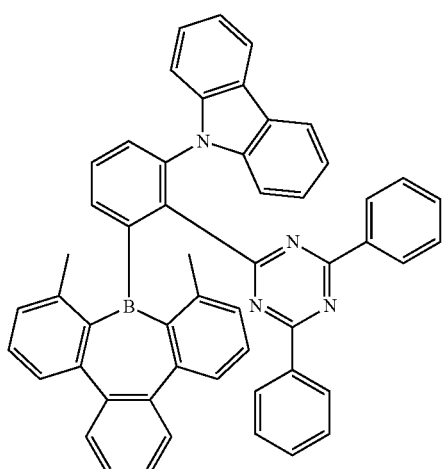
17
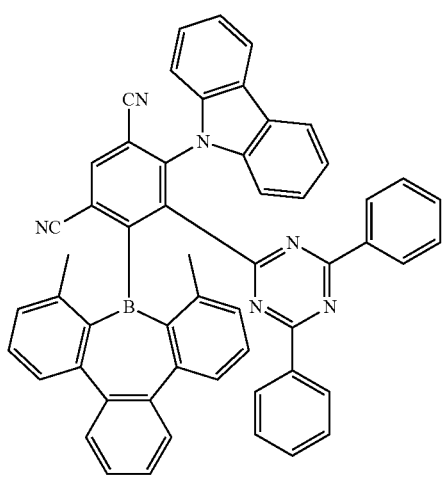
18
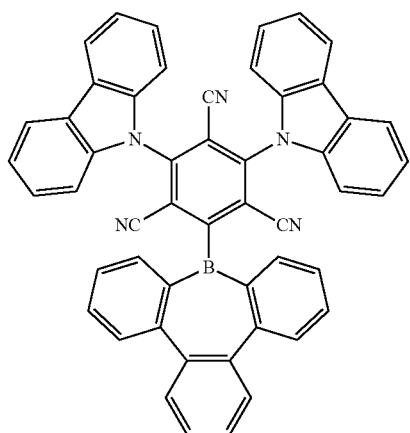
19
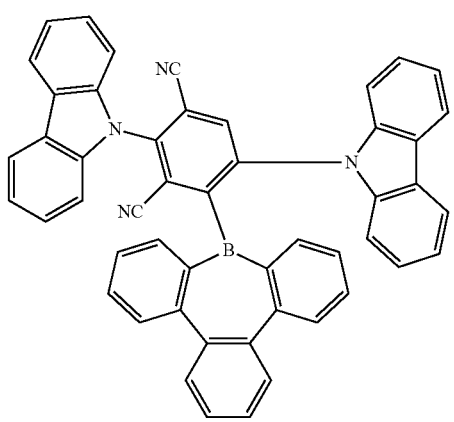
20
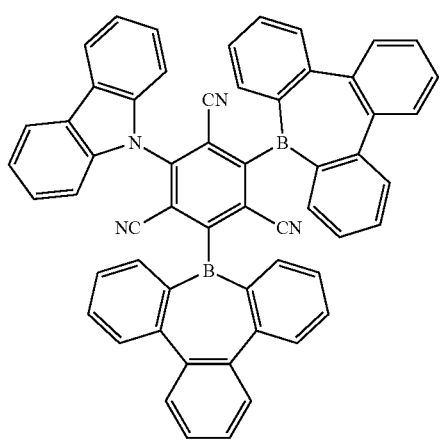

-continued

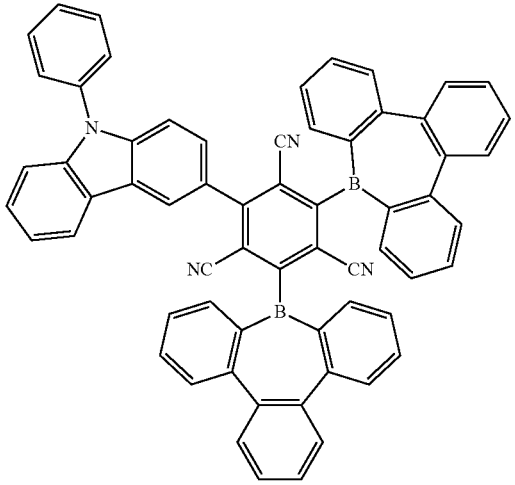

21

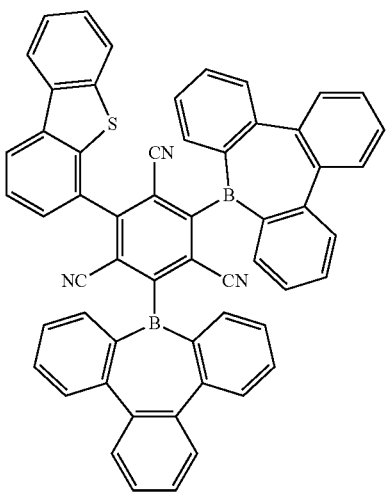

22

The organic electroluminescence device 10 according to an embodiment of the inventive concept may include at least one of the compounds represented in Compound Group 1 in at least one of organic layers. For example, the organic electroluminescence device 10 of an embodiment may include at least one of the polycyclic compounds represented in Compound Group 1 in the emission layer EML.

In the organic electroluminescence device 10 of an embodiment, the emission layer EML may emit a delayed fluorescence. For example, the emission layer EML may emit a thermally activated delayed fluorescence (TADF).

In the organic electroluminescence device 10, the emission layer EML may emit blue light. For example, in the organic electroluminescence device 10 of an embodiment, the emission layer EML may emit blue light with a wavelength range of about 480 nm or lower. However, an embodiment of the inventive concept is not limited thereto, and the emission layer EML may emit red light or green light.

Although not shown in the drawings, the organic electroluminescence device 10 of an embodiment may include a plurality of emission layers. The plurality of emission layers may be provided as laminated layers, and the organic electroluminescence device 10 including a plurality of emission layers may emit white light, for example. The organic electroluminescence device including a plurality of emission layers may be an organic electroluminescence device of a tandem structure.

In an embodiment, the emission layer EML may include a host and a dopant, and include the above-described polycyclic compound as the dopant. For example, in the organic electroluminescence device 10 of an embodiment, the emission layer EML may include a host for delayed fluorescence emission and a dopant for delayed fluorescence emission, and include the above-described polycyclic compound as the dopant for delayed fluorescence emission. The emission layer EML may include at least one of the compounds represented in the above Compound Group 1 as a thermally activated delayed fluorescence dopant.

In an embodiment, the emission layer EML may be a delayed fluorescence emission layer, and include a known host material and the above-described polycyclic compound. For example, the polycyclic compound of an embodiment may be used as a TADF dopant.

In an embodiment, the emission layer EML may include a known host material. For example, the emission layer EML may include, as a host material, tris(8-hydroxyquinolino)aluminum (Alq3), 4,4'-bis(N-carbazolyl)-1,1'-biphenyl (CBP), poly(N-vinylcarbazole) (PVK), 9,10-di(naphthalene-2-yl)anthracene (ADN), 4,4',4"-tris(carbazol-9-yl)-triphenylamine (TCTA), 1,3,5-tris(1-phenyl-1H-benzo[d]imidazole-2-yl)benzene (TPBi), 2-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane (DPSiO$_3$), octaphenylcyclotetrasiloxane (DPSiO$_4$), 2,8-bis(diphenylphosphoryl)dibenzofuran (PPF), 3,3'-bis(N-carbazolyl)-1,1'-biphenyl (mCBP), 1,3-bis(N-carbazolyl)benzene (mCP), etc. However, an embodiment of the inventive concept is not limited thereto, and a known delayed fluorescence host material may be included in addition to the above host material.

In the organic electroluminescence device 10 of an embodiment, the emission layer EML may further include a known dopant material. In an embodiment, the emission layer EML may include, as a dopant, styryl derivatives (for example, 1,4-bis[2-(3-N-ethylcarbazolyl)vinyl]benzene (BCzVB), 4-(di-p-tolylamino)-4'-[(di-p-tolylamino)styryl]stilbene (DPAVB), N-(4-((E)-2-(6-((E)-4-(diphenylamino)styryl)naphthalen-2-yl)vinyl)phenyl)-N-phenylbenzenamine (N-BDAVBi)), perylene and the derivatives thereof (for example, 2,5,8,11-tetra-t-butylperylene (TBP)), pyrene and the derivatives thereof (for example, 1,1-dipyrene, 1,4-dipyrenylbenzene, 1,4-bis(N,N-diphenylamino)pyrene), etc.

In the organic electroluminescence device 10 according to an embodiment of the inventive concept as shown in FIGS. 1 to 3, the electron transport region ETR is provided on the emission layer EML. The electron transport region ETR may include at least one of a hole blocking layer HBL, an electron transport layer ETL or an electron injection layer EIL, without limitation.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In addition, the electron transport region ETR may have a single layer structure having a plurality of different materials, or a laminated structure of electron transport layer ETL/electron injection layer EIL, or hole blocking layer HBL/electron transport layer ETL/electron injection layer EIL, laminated in order from the emission layer EML, without limitation. The thickness of the electron transport region ETR may be, for example, from about 1,000 Å to about 1,500 Å.

The electron transport region ETR may be formed using various methods such as a vacuum deposition method, a spin coating method, a cast method, a Langmuir-Blodgett (LB) method, an inkjet printing method, a laser printing method, and a laser induced thermal imaging (LITI) method.

In case the electron transport region ETR includes the electron transport layer ETL, the electron transport region ETR may include anthracene derivatives. However, an embodiment of the inventive concept is not limited thereto. For example, the electron transport region may include tris(8-hydroxyquinolinato)aluminum ($Alq_3$), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)phenyl (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-Biphenyl-4-olato)aluminum (BAlq), berylliumbis(benzoquinolin-10-olate) ($Bebg_2$), 9,10-di(naphthalen-2-yl)anthracene (ADN) and a mixture thereof. The thickness of the electron transport layer ETL may be from about 100 Å to about 1,000 Å, for example, from about 150 Å to about 500 Å. If the thickness of the electron transport layer ETL satisfies the above-described range, satisfactory electron transport properties may be obtained without substantial increase of a driving voltage.

When the electron transport region ETR includes the electron injection layer EIL, the electron transport region ETR may use LiF, lithium quinolate (LIQ), $Li_2O$, BaO, NaCl, CsF, a metal in lanthanoides such as Yb, or a metal halide such as RbCl and RbI. However, an embodiment of the inventive concept is not limited thereto. The electron injection layer EIL also may be formed using a mixture material of an electron transport material and an insulating organo metal salt. The organo metal salt may be a material having an energy band gap of about 4 eV or more. Particularly, the organo metal salt may include, for example, a metal acetate, a metal benzoate, a metal acetoacetate, a metal acetylacetonate, or a metal stearate. The thickness of the electron injection layer EIL may be from about 1 Å to about 100 Å, for example, from about 3 Å to about 90 Å. In case the thickness of the electron injection layer EIL satisfies the above described range, satisfactory electron injection properties may be obtained without inducing the substantial increase of a driving voltage.

The electron transport region ETR may include a hole blocking layer HBL, as described above. The hole blocking layer HBL may include, for example, at least one of 2,9-dimethyl-4,7-diphenyl-1,10-phenanthroline (BCP) or 4,7-diphenyl-1,10-phenanthroline (Bphen), without limitation.

The second electrode EL2 is disposed on the electron transport region ETR. The second electrode EL2 may be a common electrode or a cathode. The second electrode EL2 may be a transmissive electrode, a transflective electrode or a reflective electrode. In case the second electrode EL2 is the transmissive electrode, the second electrode EL2 may be formed using transparent metal oxides, for example, ITO, IZO, ZnO, ITZO, etc.

In case the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayer structure including a reflective layer or a transflective layer formed using the above-described materials and a transparent conductive layer formed using ITO, IZO, ZnO, ITZO, etc.

Even not shown, the second electrode EL2 may be connected with an auxiliary electrode. In case the second electrode EL2 is connected with the auxiliary electrode, the resistance of the second electrode EL2 may decrease.

Even not shown in the drawings, the organic electroluminescence device 10 according to an embodiment of the inventive concept may include a capping layer (not shown) disposed on the second electrode EL2. The capping layer (not shown) may include, for example, u-NPD, NPB, TPD, m-MTDATA, Alq3, CuPc, N4,N4,N4',N4'-tetra(biphenyl-4-yl)biphenyl-4,4'-diamine (TPD15), 4,4',4"-tris(carbazol-9-yl)-triphenylamine (TCTA), etc.

The organic electroluminescence device 10 according to an embodiment of the inventive concept may include the above-described polycyclic compound of an embodiment in at least one of organic layers disposed between the first electrode EL1 and the second electrode EL2, thereby attaining enhanced emission efficiency. Especially, the organic electroluminescence device 10 according to an embodiment of the inventive concept may include the above-described polycyclic compound of an embodiment in the emission layer EML, thereby attaining a low driving voltage and high emission efficiency properties. In addition, the organic electroluminescence device 10 according to an embodiment of the inventive concept may include the above-described polycyclic compound of an embodiment in the emission layer EML, and therefore, the emission layer EML may emit a thermally activated delayed fluorescence, thereby attaining high emission efficiency properties.

The above-described polycyclic compound of an embodiment, which includes a plurality of electron donors and an electron acceptor connecting the electron donors, includes both the electron donors and electron acceptor in a molecule, thereby facilitating electron transfer in the molecule. Accordingly, the polycyclic compound of an embodiment may be used in an organic layer of the organic electroluminescence device of an embodiment to improve emission efficiency of the device. Furthermore, the polycyclic compound of an embodiment includes at least one electron donor including a borepine core and an electron acceptor including a cyano group, a triazine group, or a heteroarylene group including O or S for forming a ring, thereby forming a dipole moment between the electron donor and electron acceptor in the molecule. Accordingly, the polycyclic compound of an embodiment have increased dipole moment in the molecule, thereby enhancing emission efficiency when used in the emission layer of organic electroluminescence device.

Furthermore, the polycyclic compound of an embodiment may emit a thermally activated delayed fluorescence, thereby enhancing emission efficiency of the organic electroluminescence device.

Hereinafter, the polycyclic compound according to an embodiment of the inventive concept and the organic electroluminescence device of an embodiment will be explained in more detail with reference to specific embodiments and comparative embodiments. The following embodiments are illustrated only for assisting the understanding of the inventive concept, and the scope of the inventive concept is not limited thereto.

EXAMPLES

1. Synthesis of Polycyclic Compound

First of all, the synthesis of polycyclic compound according to an embodiment of the inventive concept will be explained in more detail with reference to the exemplified synthetic methods of Compounds 1, 4, 7, 13, and 18. The following synthetic methods are exemplary embodiments, however, the synthetic method of the polycyclic compound according to an embodiment of the inventive concept is not limited thereto.

(1) Synthesis of Compound 1

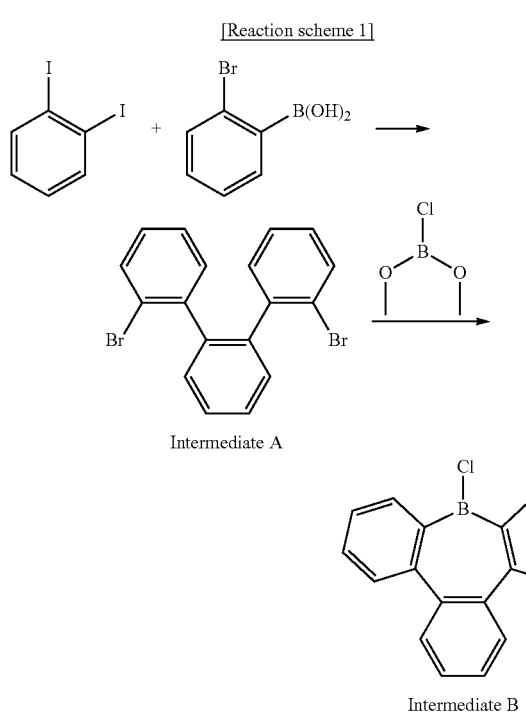

Synthesis of Intermediate A 1,2-Diiodobenzene (1eq) and (2-bromophenyl)boronic acid (2.1eq) were dissolved in toluene (500 mL). Pd(PPh$_3$)$_4$ (0.02eq) was added thereto. Additionally, toluene (400 mL) and a saturated solution of 2M K$_2$CO$_3$ (70 mL) were added thereto, and the mixture was stirred under reflux for about 5 hours. After the completion of reaction, the reactant was extracted and washed with methylene chloride (MC) (400 mL) and distilled water (150 mL), and then solvent was removed. The solid thus obtained was purified by column chromatography to obtain Intermediate A (yield 65.7%). Intermediate A was identified by the molecular weight measured by mass spectrometer. (HRMS for C$_{18}$H$_{12}$Br$_2$ [M]+: calcd: 388, found: 387)

Synthesis of Intermediate B

Intermediate A (1eq) was dissolved in hexane (500 mL). After cooling the reaction vessel to about 0° C., dimethyl chloroborate (2.2eq) was slowly added thereto dropwisely, and the mixture was stirred for about 5 hours. After the completion of reaction, the reactant was extracted and washed with MC (200 mL) and distilled water (150 mL), and then solvent was removed. The solid thus obtained was recrystallized with MeOH and ether to obtain Intermediate B (yield 55.8%). Intermediate B was identified by the molecular weight measured by mass spectrometer. (HR-MS for C$_{18}$H$_{12}$BCl [M]+: calcd: 275, found: 274)

Synthesis of Compound 1

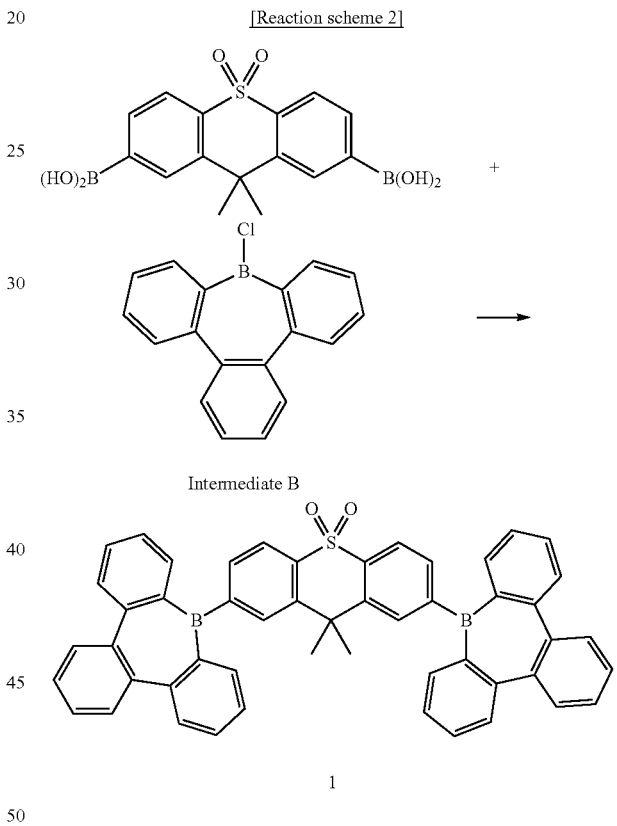

(9,9-Dimethyl-10,10-dioxido-9H-thioxanthene-2,7-diyl)diboronic acid (1eq) and Intermediate B (2.2eq) were dissolved in toluene (500 mL). Pd(PPh$_3$)$_4$ (0.02eq) and a saturated solution of 2M K$_2$CO$_3$ (70 mL) were added thereto, and the mixture was stirred under reflux for about 4 hours. After the completion of reaction, the reactant was extracted and washed with MC (400 mL) and distilled water (200 mL), and then solvent was removed. The solid thus obtained was purified by column chromatography to obtain Compound 1 (yield 77.5%). Compound 1 was identified by the molecular weight measured by mass spectrometer. (HRMS for C$_{51}$H$_{36}$B$_2$O$_2$S [M]+: calcd: 734, found: 733)

(2) Synthesis of Compound 4

Compound 4, a polycyclic compound according to an embodiment of the inventive concept, may be synthesized as shown in the following Reaction scheme 3, for example.

[Reaction scheme 3]

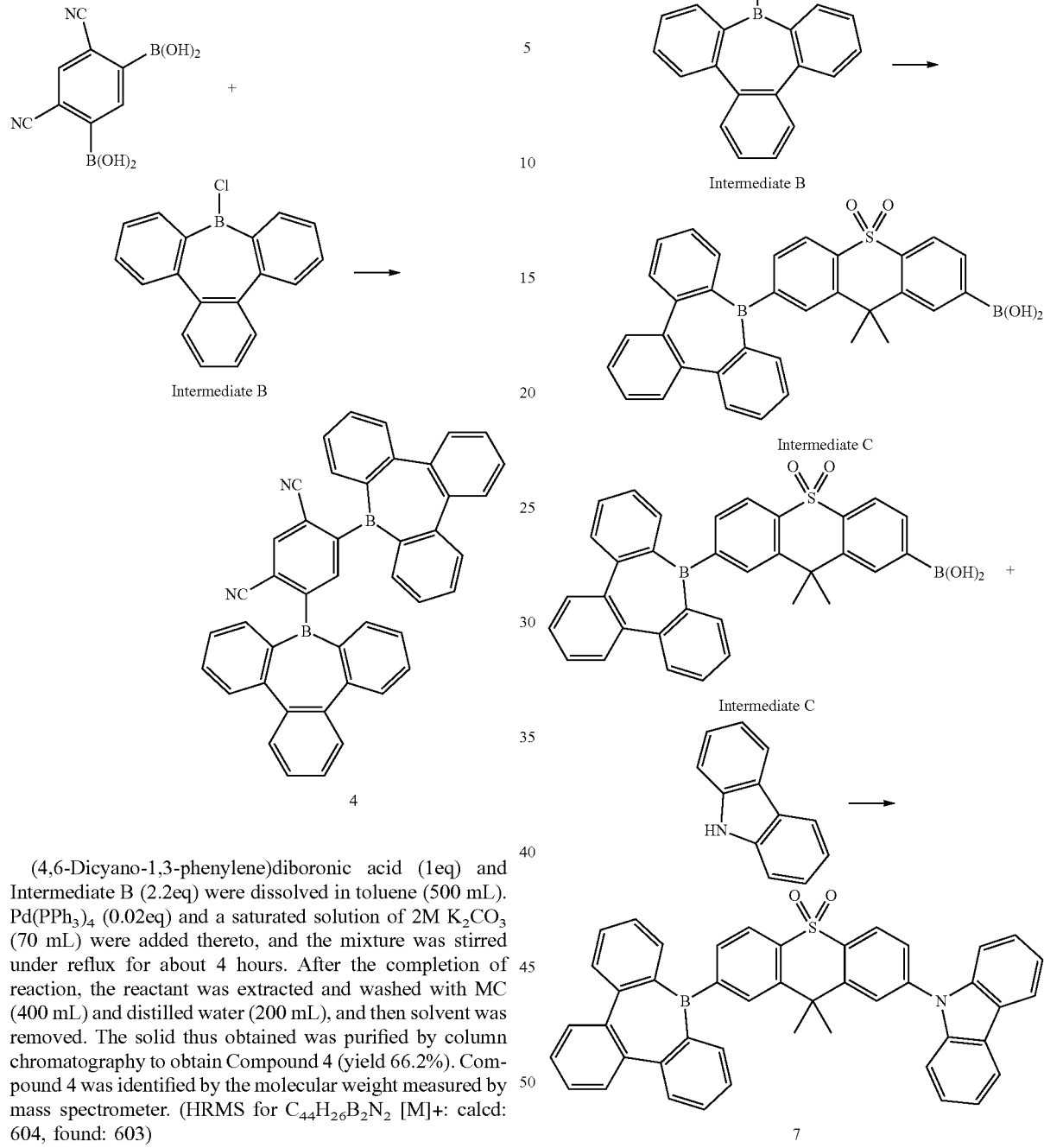

(4,6-Dicyano-1,3-phenylene)diboronic acid (1eq) and Intermediate B (2.2eq) were dissolved in toluene (500 mL). Pd(PPh₃)₄ (0.02eq) and a saturated solution of 2M K₂CO₃ (70 mL) were added thereto, and the mixture was stirred under reflux for about 4 hours. After the completion of reaction, the reactant was extracted and washed with MC (400 mL) and distilled water (200 mL), and then solvent was removed. The solid thus obtained was purified by column chromatography to obtain Compound 4 (yield 66.2%). Compound 4 was identified by the molecular weight measured by mass spectrometer. (HRMS for $C_{44}H_{26}B_2N_2$ [M]+: calcd: 604, found: 603)

(3) Synthesis of Compound 7

[Reaction scheme 4]

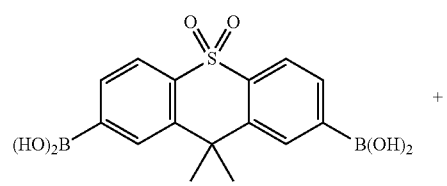

Synthesis of Intermediate C (9,9-Dimethyl-10,10-dioxido-9H-thioxanthene-2,7-diyl)diboronic acid (1eq) and Intermediate B (1.1eq) were dissolved in toluene (500 mL). Pd(PPh₃)₄ (0.02eq) and a saturated solution of 2M K₂CO₃ (70 mL) were added thereto, and the mixture was stirred under reflux for about 4 hours. After the completion of reaction, the reactant was extracted and washed with MC (400 mL) and distilled water (200 mL), and then solvent was removed. The solid thus obtained was purified by column chromatography to obtain Intermediate C (yield 69.4%). Intermediate C was identified by the molecular weight measured by mass spectrometer. (HRMS for $C_{33}H_{26}B_2O_4S$ [M]+: calcd: 540, found: 539)

Synthesis of Compound 7

Intermediate C (1eq) and carbazole (1.2eq) were dissolved in toluene (500 mL). $Pd(PPh_3)_4$ (0.02eq) and a saturated solution of 2M $K_2CO_3$ (70 mL) were added thereto, and the mixture was stirred under reflux for about 4 hours. After the completion of reaction, the reactant was extracted and washed with MC (400 mL) and distilled water (200 mL), and then solvent was removed. The solid thus obtained was purified by column chromatography to obtain Compound 7 (yield 82.4%). Compound 7 was identified by the molecular weight measured by mass spectrometer. (HRMS for $C_{45}H_{32}BNO_2S$ [M]+: calcd: 661, found: 660)

(4) Synthesis of Compound 13

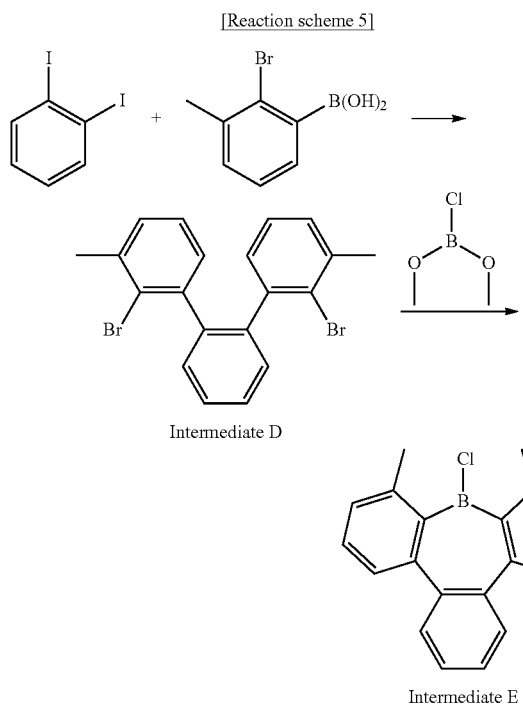

Synthesis of Intermediate D

Intermediate D (yield 68%) was synthesized by conducting the same synthetic method of Intermediate A except for using (2-bromo-3-methylphenyl)boronic acid instead of (2-bromophenyl)boronic acid in Reaction scheme 1. Intermediate D was identified by the molecular weight measured by mass spectrometer. (HRMS for $C_{20}H_{16}Br_2$ [M]+: calcd: 416, found: 415)

Synthesis of Intermediate E

Intermediate E (yield 51.7%) was synthesized by conducting the same synthetic method of Intermediate B using Intermediate D in Reaction scheme 1. Intermediate E was identified by the molecular weight measured by mass spectrometer. (HRMS for $C_{20}H_{16}BCl$ [M]+: calcd: 302, found: 301)

Synthesis of Compound 13

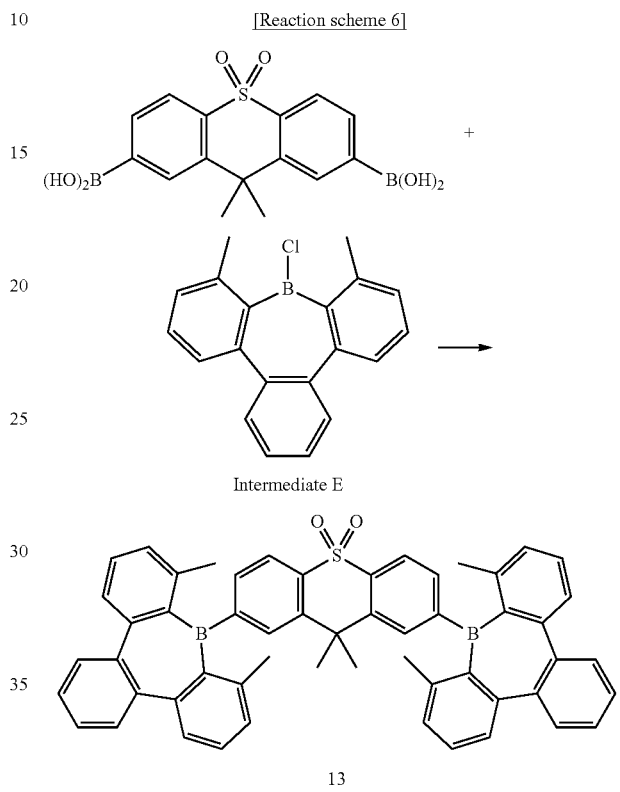

Compound 13 (yield 82.7%) was synthesized by conducting the same synthetic method of Compound 1 using (9,9-dimethyl-10,10-dioxido-9H-thioxanthene-2,7-diyl)diboronic acid (1eq) and Intermediate E (1.2eq) in Reaction scheme 2. Compound 13 was identified by the molecular weight measured by mass spectrometer. (HRMS for $C_{55}H_{44}B_2O_2S$ [M]+: calcd: 790, found: 789)

(5) Synthesis of Compound 18

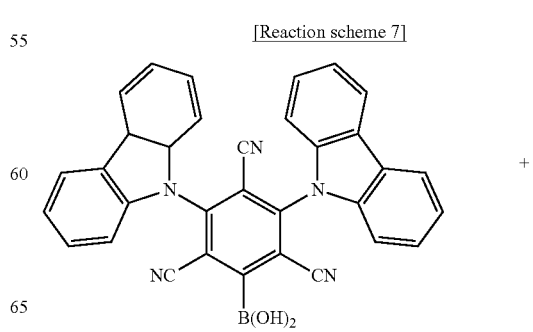

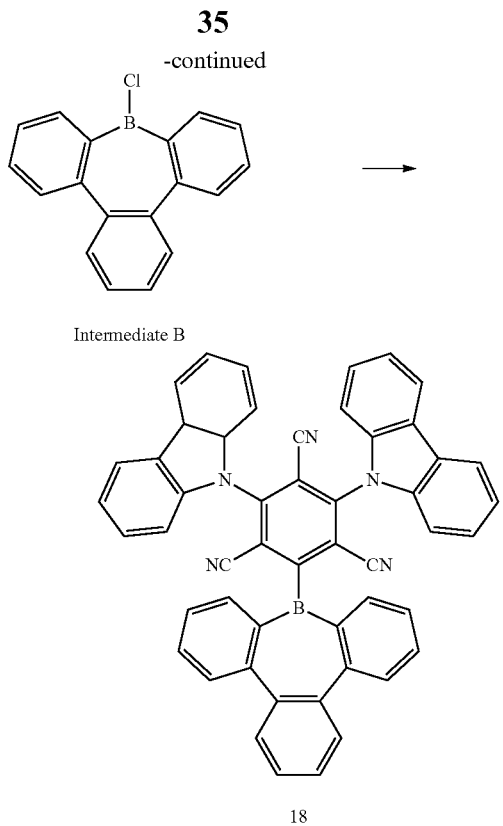

Intermediate B (1eq) and (3,5-di(9H-carbazol-9-yl)-2,4,6-tricyanophenyl)boronic acid (1.2eq) were dissolved in toluene (500 mL). Pd(PPh$_3$)$_4$ (0.02eq) and a saturated solution of 2M K$_2$CO$_3$ (70 mL) were added thereto, and the mixture was stirred under reflux for about 4 hours. After the completion of reaction, the reactant was extracted and washed with MC (400 mL) and distilled water (200 mL), and then solvent was removed. The solid thus obtained was purified by column chromatography to obtain Compound 18 (yield 77.9%). Compound 18 was identified by the molecular weight measured by mass spectrometer. (HRMS for C$_{51}$H$_{28}$BN$_5$ [M]+: calcd: 721, found: 720)

2. Evaluation of Energy Level of Compound

Table 1 shows the HOMO energy level, the LUMO energy level, the lowest singlet excitation energy level (Si level) and the lowest triplet excitation energy level (T1 level), and $\Delta E_{ST}$ value of Example Compounds 1, 4, 7, 13, and 18.

The energy level values of Table 1 were calculated by ab initio molecular orbital method, specifically, by B3LYP/6-31G (d) using Gaussian09 (Gaussian, Inc.). $\Delta E_{ST}$ shows the difference between the lowest singlet energy level (S1 level) and the lowest triplet energy level (T1 level).

TABLE 1

| Compounds | HOMO (eV) | LUMO (eV) | S1 (eV) | T1 (eV) | ΔEst (eV) |
|---|---|---|---|---|---|
| Compound 1 | −5.48 | −2.19 | 2.69 | 2.56 | 0.13 |
| Compound 4 | −5.87 | −2.45 | 2.81 | 2.61 | 0.02 |
| Compound 7 | −5.82 | −2.41 | 2.79 | 2.6 | 0.16 |
| Compound 13 | −5.84 | −2.39 | 2.83 | 2.63 | 0.2 |
| Compound 18 | −5.78 | −2.31 | 2.85 | 2.64 | 0.21 |

TABLE 1-continued

| Compounds | HOMO (eV) | LUMO (eV) | S1 (eV) | T1 (eV) | ΔEst (eV) |
|---|---|---|---|---|---|
| Comparative Compound C1 | −5.09 | −1.87 | 2.78 | 2.67 | 0.11 |

Example Compounds 1, 4, 7, 13, and 18 have $\Delta E_{ST}$ of about 0.25 eV or less. Accordingly, it is considered that Example Compounds 1, 4, 7, 13, and 18 may be used as a dopant material for a thermally activated delayed fluorescence. Comparative Compound C1 also has a low $\Delta E_{ST}$ value, and seems to be used as a dopant material for a thermally activated delayed fluorescence.

3. Manufacturing of Organic Electroluminescence Devices Including Polycyclic Compounds and Evaluation Thereof (Manufacturing of Organic Electroluminescence Devices)

The organic electroluminescence devices of an embodiment including the polycyclic compounds of an embodiment were manufactured by the following method. The organic electroluminescence devices of Examples 1 to 5 were manufactured by using the above Compounds 1, 4, 7, 13, and 18 as a dopant material in an emission layer.

The organic electroluminescent device of Comparative Example 1 was manufactured by using the following BH1 as a host material and BD1 as a dopant material.

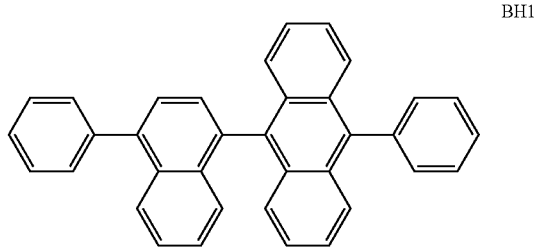

BH1

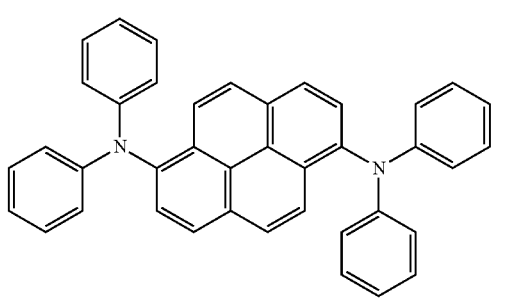

BD1

The organic electroluminescent device of Comparative Example 2 was manufactured by using mCBP as a host material as in Examples, and Comparative Compound C1 as a dopant material.

The compounds used in Examples 1 to 5 and Comparative Compound C1 are shown in Table 2.
TABLE 2
Compound 1
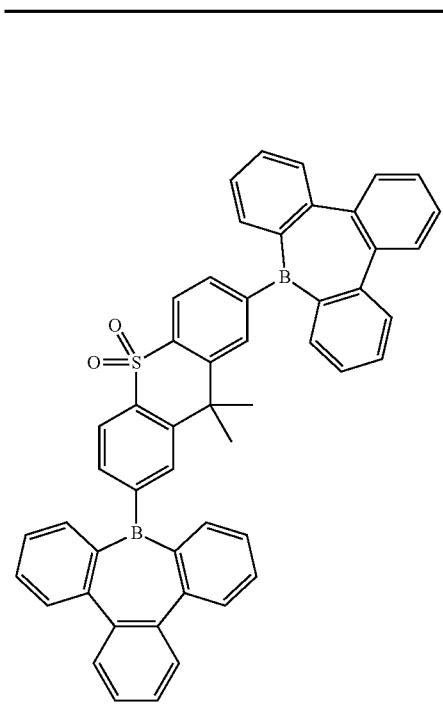
1
Compound 4
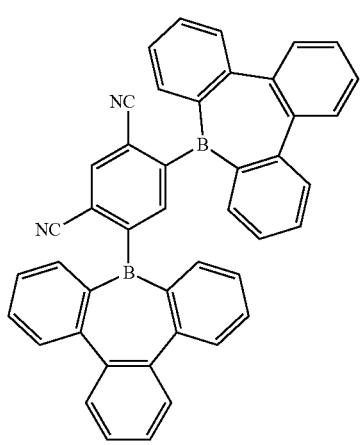
4
TABLE 2-continued
Compound 7
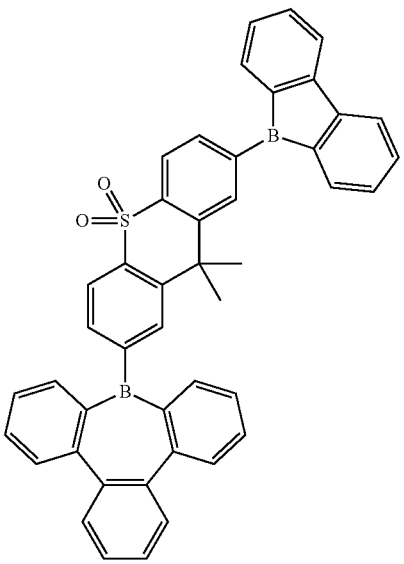
7
Compound 13
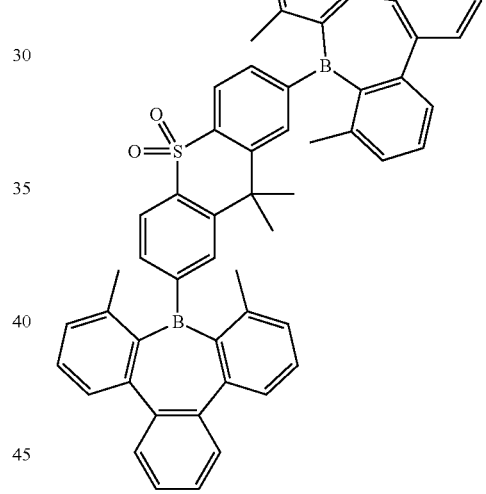
13
Compound 18
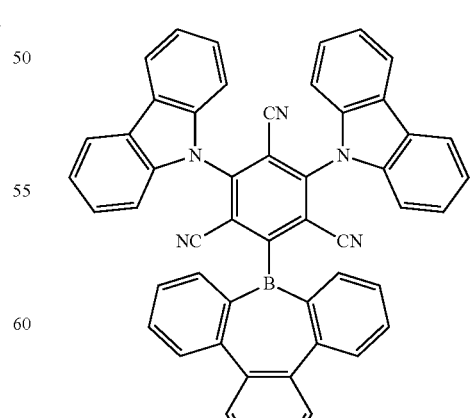
18

TABLE 2-continued

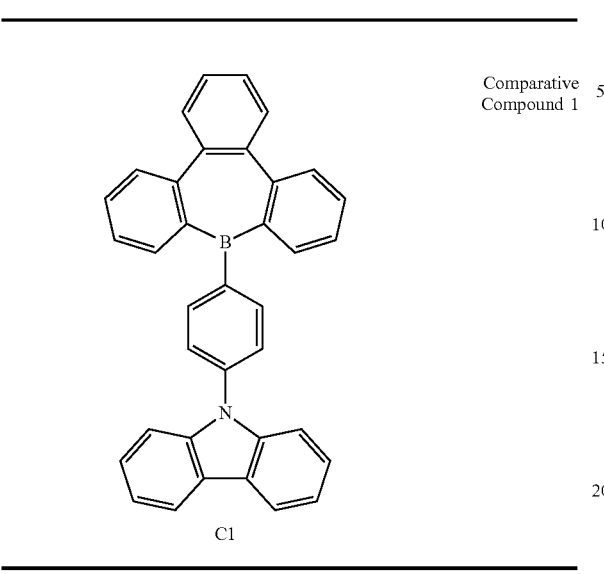

Comparative Compound 1

C1

On a glass substrate, ITO with a thickness of about 1,200 Å was patterned to form a first electrode, which was washed with isopropyl alcohol and ultrapure water and cleaned with ultrasonic waves, exposed to UV for about 30 minutes, and treated with ozone. Then, NPB was deposited to a thickness of about 400 Å to form a hole injection layer, and mCP was deposited to a thickness of about 10 Å to form a hole transport layer.

On the hole transport layer, mCBP and the polycyclic compounds of an embodiment or Comparative Compound C1 were co-deposited in the ratio of 85:15 to form an emission layer with a thickness of about 200 Å. That is, in Examples 1 to 5, each of Compounds 1, 4, 7, 13, and 18 mixed with mCBP was deposited to form an emission layer. In Comparative Example 1, BH1 and BD1 were mixed and deposited to form an emission layer, and in Comparative Example 2, Comparative Compound C1 mixed with mCBP was deposited to form an emission layer.

On the emission layer, an electron transport layer was formed using ETL1 material to a thickness of about 300 Å, and a second electrode was formed using aluminum (Al) to a thickness of about 1,200 Å.

The materials used for the manufacture of the organic electroluminescence devices of Examples and Comparative Examples are shown below.

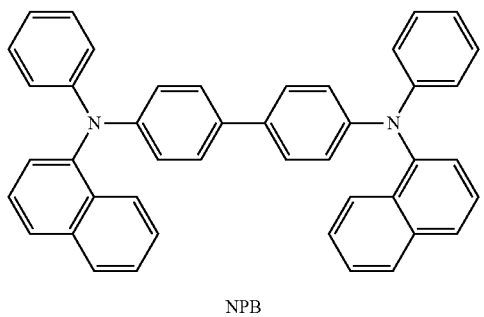

NPB

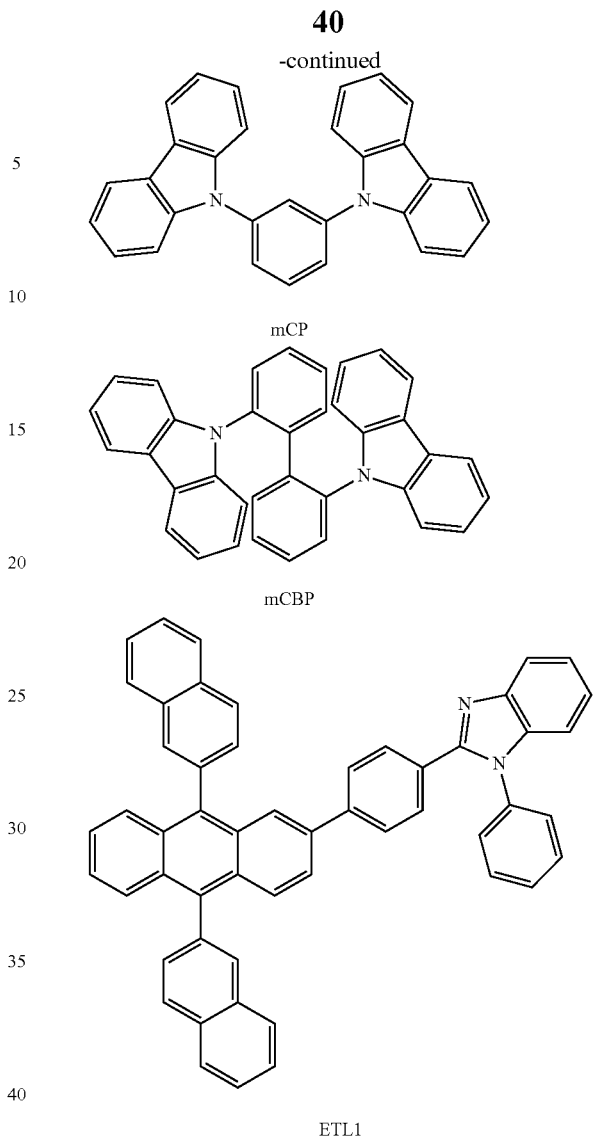

mCP mCBP

ETL1

(Property Evaluation of Organic Electroluminescence Devices)

In Table 3, the evaluation results of the organic electroluminescence devices of Examples 1 to 5 and Comparative Examples 1 and 2 are shown. Table 3 shows a driving voltage, emission efficiency and external quantum efficiency (EQE) for the organic electroluminescence devices manufactured in Examples and Comparative Examples. In the property evaluation results of Table 3, emission efficiency was a current efficiency value at a current density of 10 mA/cm$^2$.

TABLE 3

| Device manufacturing examples | Dopant material of emission layer | Driving voltage (V) | Emission efficiency (cd/A) | EQE (%) |
| --- | --- | --- | --- | --- |
| Example 1 | Compound 1 | 5.25 | 10.22 | 6.9 |
| Example 2 | Compound 4 | 5.44 | 10.1 | 6.78 |
| Example 3 | Compound 7 | 5.62 | 10.7 | 6.98 |
| Example 4 | Compound 13 | 5.7 | 11.76 | 6.88 |
| Example 5 | Compound 18 | 5.68 | 12.54 | 7.0 |
| Comparative Example 1 | BD1 | 7.44 | 4.84 | 2.99 |

TABLE 3-continued

| Device manufacturing examples | Dopant material of emission layer | Driving voltage (V) | Emission efficiency (cd/A) | EQE (%) |
|---|---|---|---|---|
| Comparative Example 2 | Comparative Compound C1 | 6.1 | 8.4 | 5.9 |

Referring to the results in Table 3, it may be found that the organic electroluminescence devices of Examples using the polycyclic compounds according to an embodiment of the inventive concept as a material for an emission layer have a low driving voltage, high emission efficiency and high external quantum efficiency when compared with those of Comparative Examples.

Specifically, the organic electroluminescence devices of Examples 1 to 5 showed enhanced emission efficiency when compared with that of Comparative Example 1 including BD1, a typical dopant material for fluorescence, in the emission layer. Accordingly, it may be found that the polycyclic compounds used in Examples emit a thermally activated delayed fluorescence.

Furthermore, the organic electroluminescence device of Comparative Example 2 used the same host material as in Examples 1 to 5 and Comparative Compound C1 as a dopant. Compared with the polycyclic compounds used in Examples, however, Comparative Compound C1 includes no electron acceptor, and therefore, the organic electroluminescence devices of Examples 1 to 5 seem to show a low driving voltage, high emission efficiency and high external quantum efficiency, when compared with that of Comparative Example 2. That is, the organic electroluminescence device of Comparative Example 2 using Comparative Compound C1, which has a low $\Delta E_{ST}$ value to be used as a thermally activated delayed fluorescence material, similar to Example Compounds, shows high emission efficiency, when compared with that of Comparative Example 1. However, Comparative Compound C1 has a structure different from that of Example Compounds, and therefore, the organic electroluminescence device of Comparative Example 2 seems to show a high driving voltage, low emission efficiency and low external quantum efficiency, when compared with those of Examples.

That is, compared with the dopant compounds used in Comparative Examples 1 and 2, the polycyclic compounds according to an embodiment of the inventive concept used in Examples, which include both the electron donor and electron acceptor in one compound unit, may emit a delayed fluorescence, thereby attaining high device efficiency. Furthermore, the polycyclic compounds used in Examples may attain enhanced device efficiency with low driving voltage, when compared with Comparative Examples.

The organic electroluminescence device according to an embodiment of the inventive concept may attain improved device properties of a low driving voltage and high efficiency.

The polycyclic compound according to an embodiment of the inventive concept may be included in an emission layer of an organic electroluminescence device, thereby contributing to high efficiency of the device.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

Accordingly, the scope of the inventive concept is to be determined by the broadest permissible interpretation of the following claims and their equivalents, and shall not be restricted or limited by the foregoing detailed description.

What is claimed is:

1. An organic electroluminescence device, comprising:
a first electrode;
a second electrode disposed on the first electrode; and
a plurality of organic layers disposed between the first electrode and the second electrode,
wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof,
at least one of the plurality of organic layers comprises a polycyclic compound represented by Formula 1:

$$[DU1\text{-}\!\!\!+\!\!\!\text{-}AU\text{-}\!\!\!+\!\!\!\text{-}DU2]_m \qquad \text{[Formula 1]}$$

in Formula 1,
DU1 and DU2 are represented by the following Formula 2-1 or 2-2, and at least one of DU1 or DU2 is represented by the following Formula 2-1,
AU is represented by one of A2 to A7 and
m is 1 or 2:

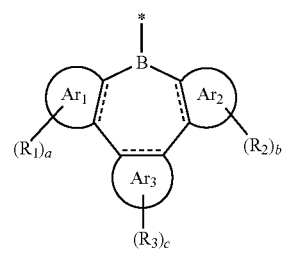

[Formula 2-1]

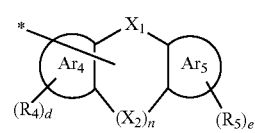

[Formula 2-2]

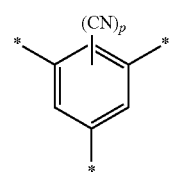

A2

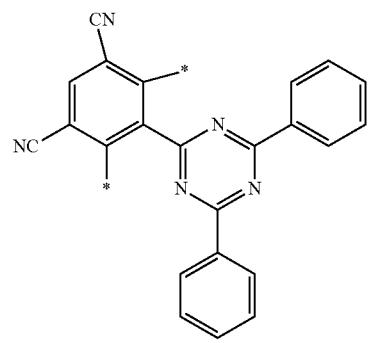

A3

-continued

A4
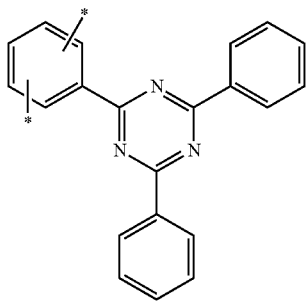

A5
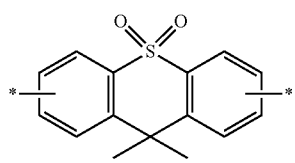

A6
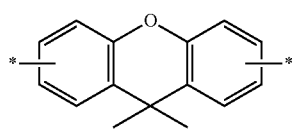

A7
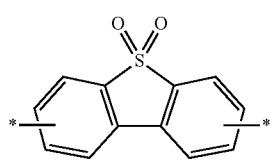

in Formula 2-2,
X₁ is N, or NR$_a$,
X₂ is a direct linkage, CR$_b$R$_c$, or (CR$_d$)=(CR$_e$), and
n is 1 to 2,
in Formulae 2-1 and 2-2,
Ar₁ to Ar₅ are each independently a hydrocarbon ring having 5 to 60 carbon atoms for forming a ring, or a heterocycle having 5 to 60 carbon atoms for forming a ring which comprises no nitrogen atom for forming a ring,
a to e are each independently an integer of 0 to 4, and
R₁ to R₅ and R$_a$ to R$_e$ are each independently a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring, and
in A2 to A7,
p is an integer of 1 to 3.

2. The organic electroluminescence device of claim 1, wherein the plurality of organic layers comprise:
a hole transport region;
an emission layer disposed on the hole transport region and comprising the polycyclic compound; and
an electron transport region disposed on the emission layer.

3. The organic electroluminescence device of claim 2, wherein the emission layer emits a delayed fluorescence.

4. The organic electroluminescence device of claim 2, wherein the emission layer is a delayed fluorescence emission layer comprising a host and a dopant, and the dopant comprises the polycyclic compound.

5. The organic electroluminescence device of claim 2, wherein the emission layer emits blue light.

6. The organic electroluminescence device of claim 1, wherein the plurality of organic layers are provided by an inkjet process.

7. The organic electroluminescence device of claim 1, wherein Formula 2-1 is represented by the following Formula 2-1A:

[Formula 2-1A]

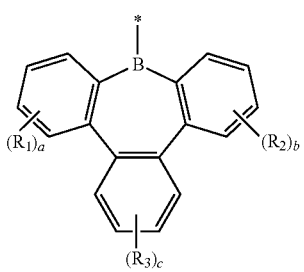

in Formula 2-1A,
R₁ to R₃, and a to c are the same as defined in Formula 2-1.

8. The organic electroluminescence device of claim 1, wherein Formula 2-2 is represented by the following Formula 2-2 A or 2-2B:

[Formula 2-2A]

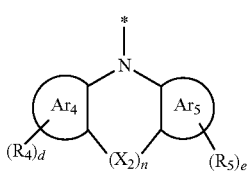

[Formula 2-2B]

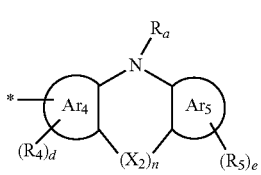

in Formulae 2-2 A and 2-2B,
Ar₄, Ar₅, R₄, R₅, d, e, X₂, n, and R$_a$ are the same as defined in Formula 2-2.

9. The organic electroluminescence device of claim 1, wherein the polycyclic compound comprises at least one selected from the group consisting of compounds represented in the following Compound Group 1:

[Compound Group 1]
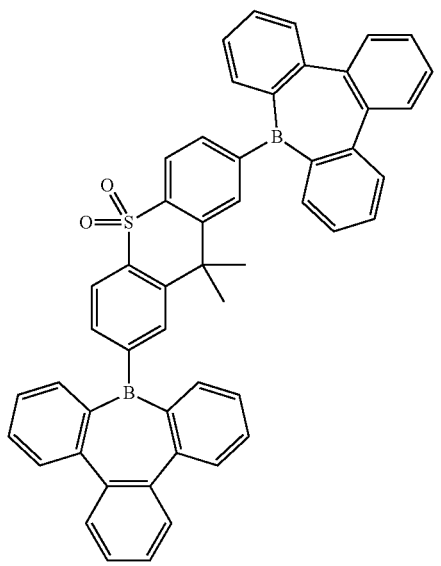
1
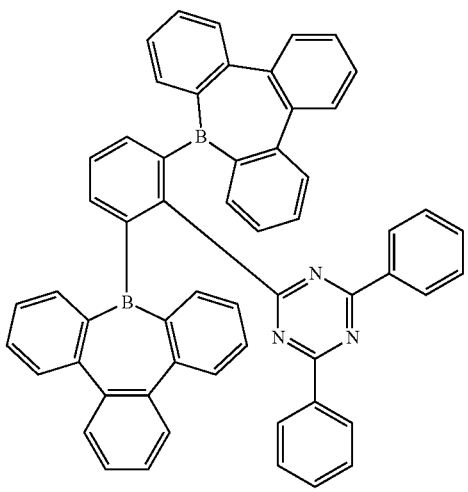
5
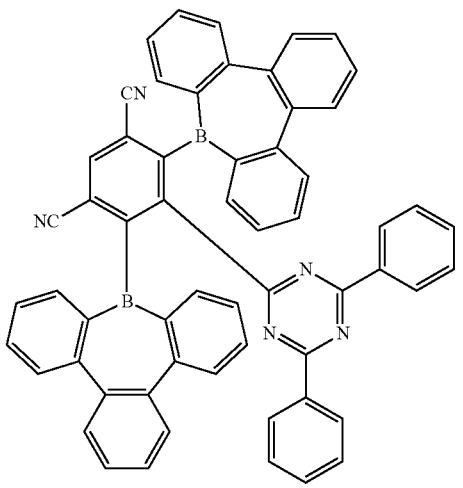
6
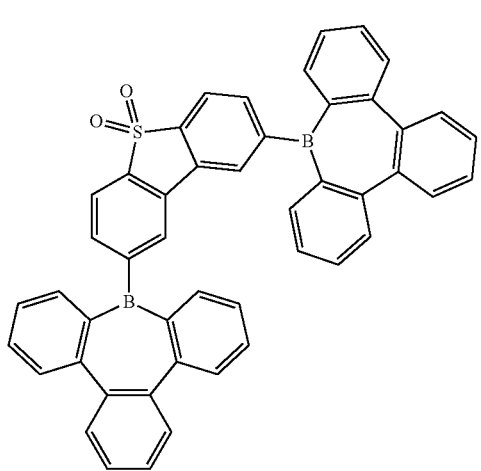
2
3
7

8
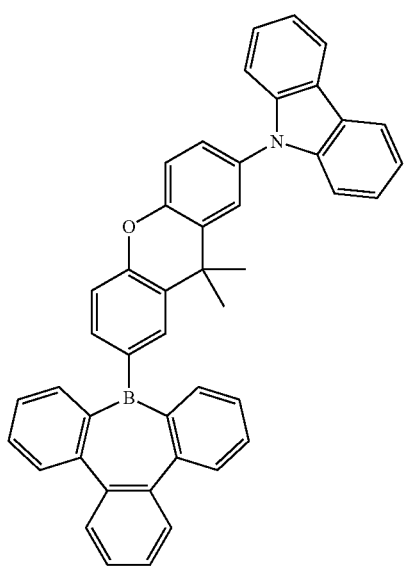
9
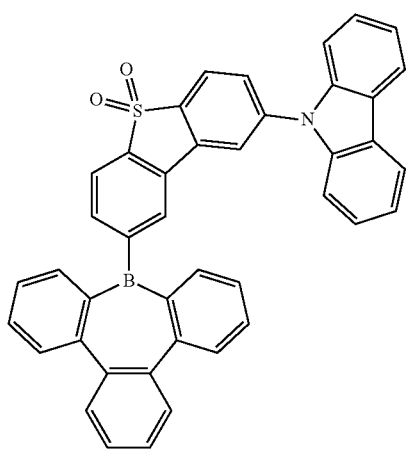
11
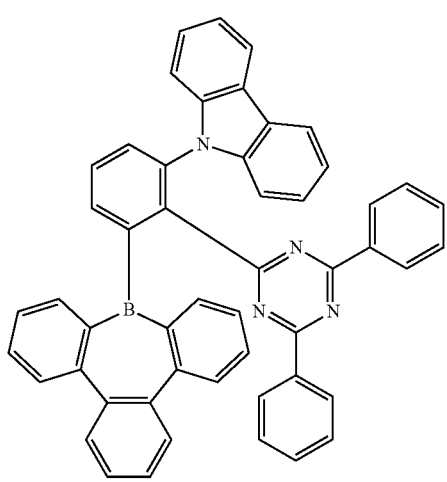
12
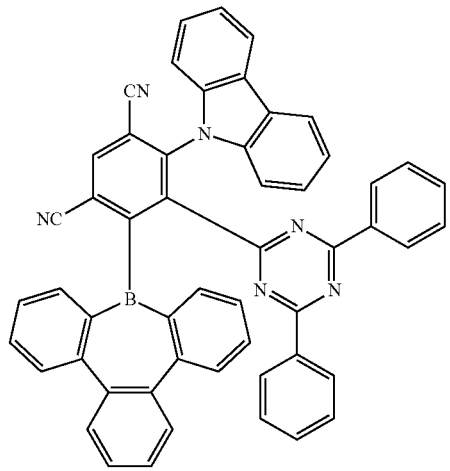
13
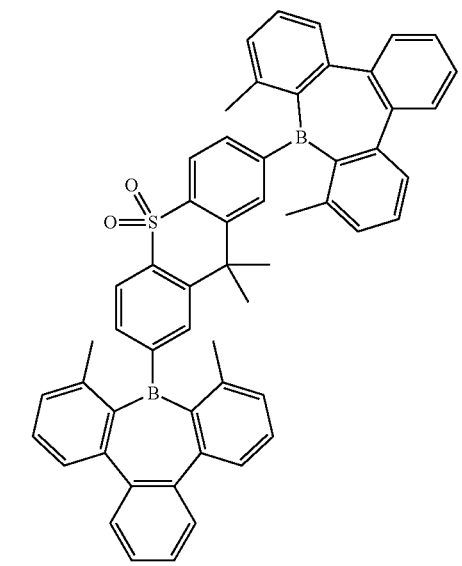
14
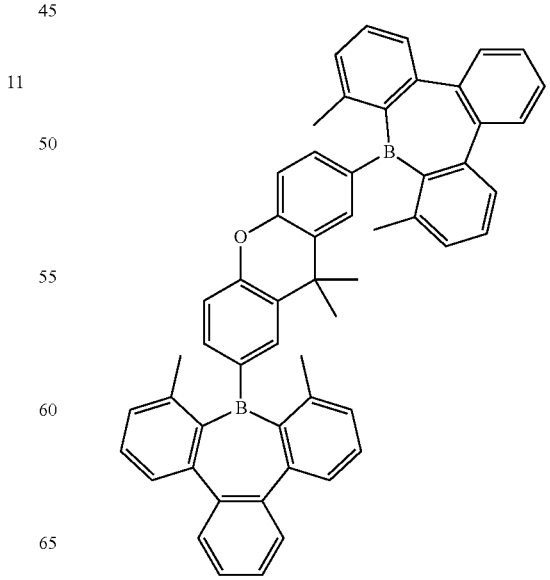

-continued
15
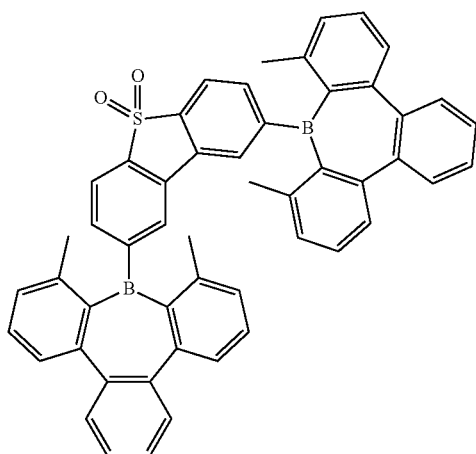
16
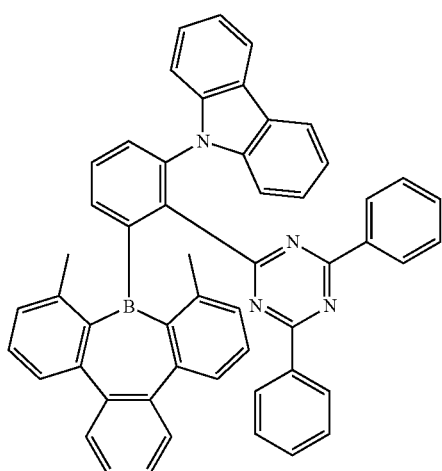
17
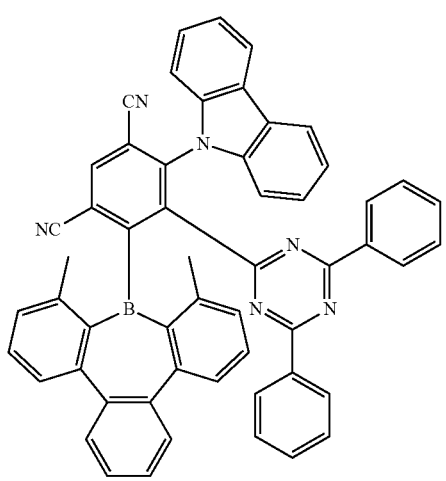
-continued
18
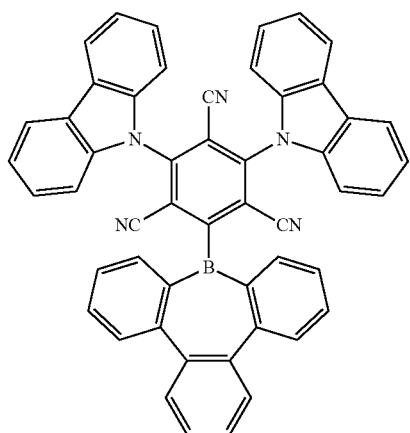
19
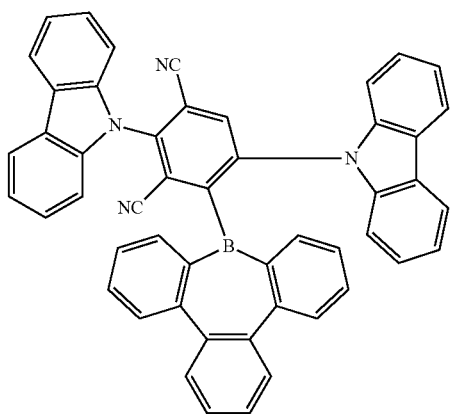
20
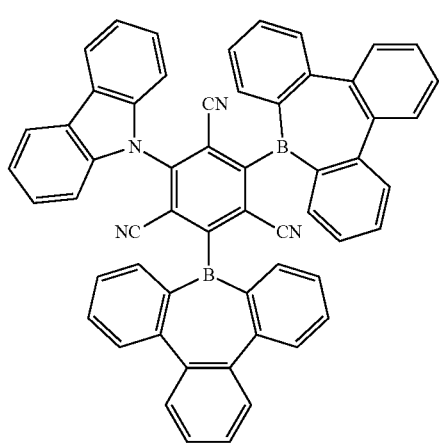

-continued

21

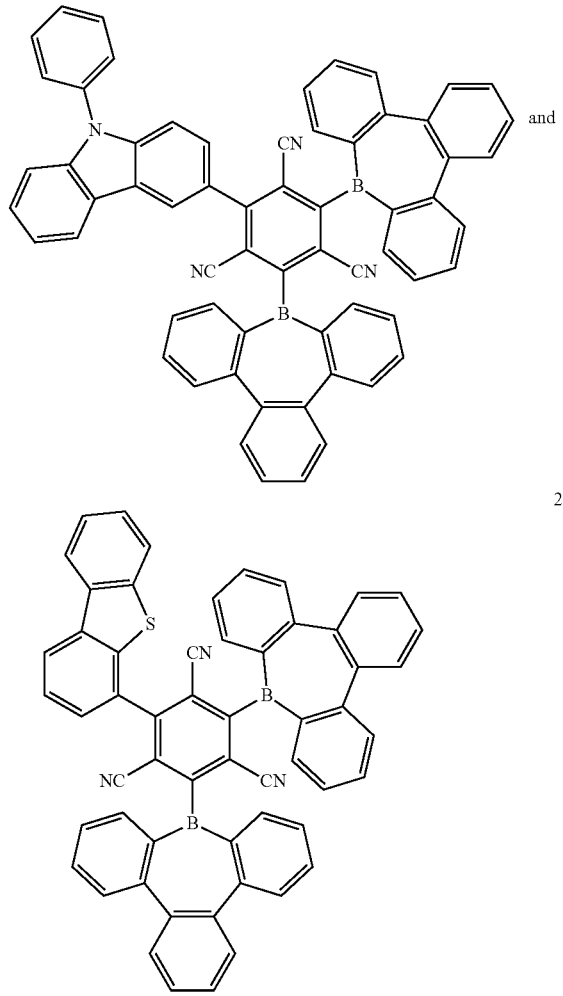

22

10. An organic electroluminescence device, comprising:

a first electrode;

a hole transport region disposed on the first electrode;

an emission layer disposed on the hole transport region, the emission layer comprising a polycyclic compound represented by the following Formula 1;

an electron transport region disposed on the emission layer; and a second electrode disposed on the electron transport region, wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof:

$[DU1\!-\!\!-\!AU\!-\!\!-\!DU2]_m$ [Formula 1]

in Formula 1,

DU1 and DU2 are represented by the following Formula 2-1 or 2-2, and at least one of DU1 or DU2 is represented by the following Formula 2-1, AU is represented by one of A2 to A7, and m is 1 or 2:

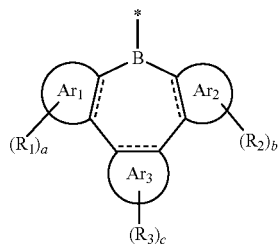

[Formula 2-1]

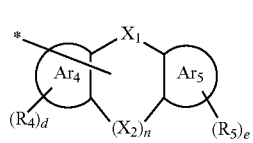

[Formula 2-2]

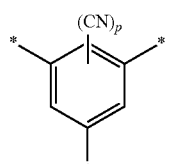

A2

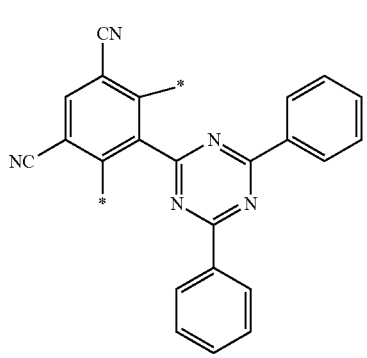

A3

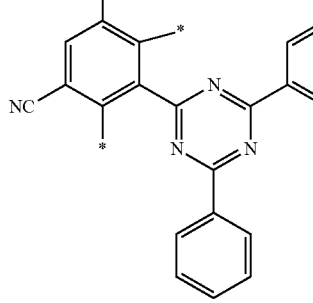

A4

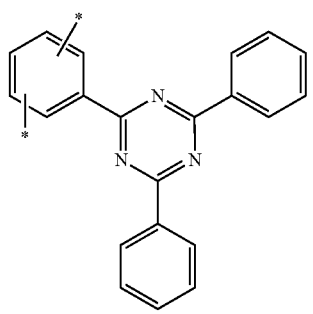

A5

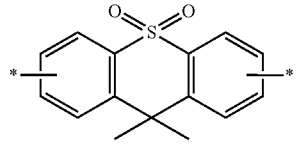

A6

-continued

A7

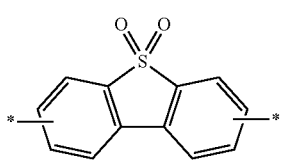

in Formula 2-2,
$X_1$ is N, or $NR_a$,
$X_2$ is a direct linkage, $CR_bR_c$, or $(CR_d)=(CR_e)$, and
n is 1 to 2,
in Formulae 2-1 and 2-2,
$Ar_1$ to $Ar_5$ are each independently a hydrocarbon ring having 5 to 60 carbon atoms for forming a ring, or a heterocycle having 5 to 60 carbon atoms for forming a ring which comprises no nitrogen atom for forming a ring,
a to e are each independently an integer of 0 to 4, and
$R_1$ to $R_5$ and $R_a$ to $R_e$ are each independently a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring, and
in A2 to A7,
p is an integer of 1 to 3.

11. The organic electroluminescence device of claim 10, wherein the emission layer emits a delayed fluorescence.

12. The organic electroluminescence device of claim 10, wherein the emission layer is a delayed fluorescence emission layer comprising a host and a dopant, and the dopant comprises the polycyclic compound represented by Formula 1.

13. The organic electroluminescence device of claim 10, wherein the emission layer comprises at least one selected from the group consisting of compounds represented in the following Compound Group 1:

[Compound Group 1]

1

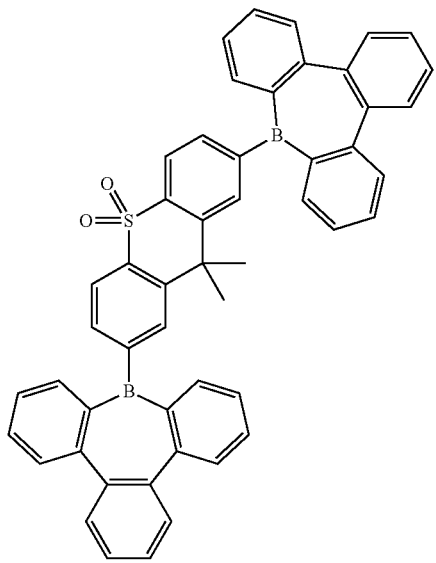

2

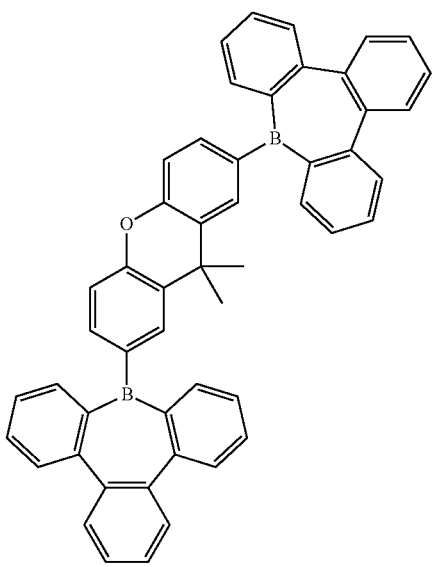

3

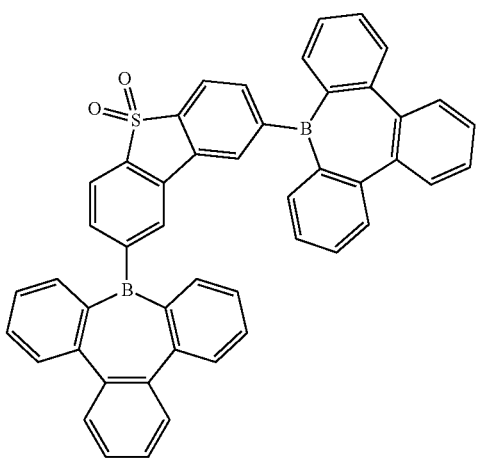

5

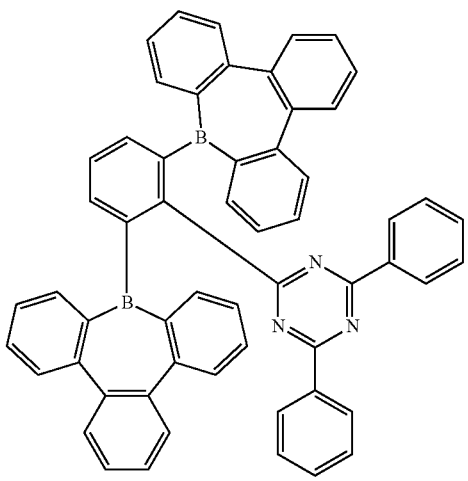

-continued
6
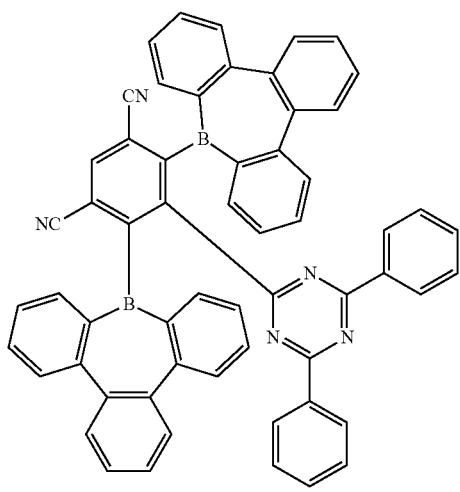
5
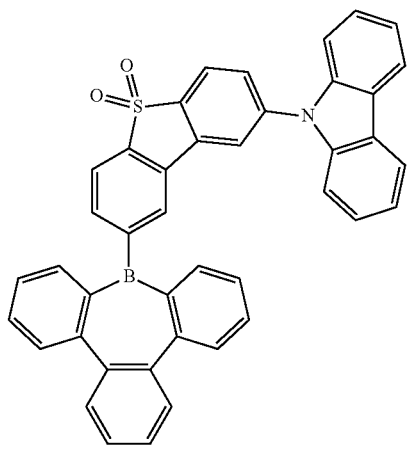
9
7
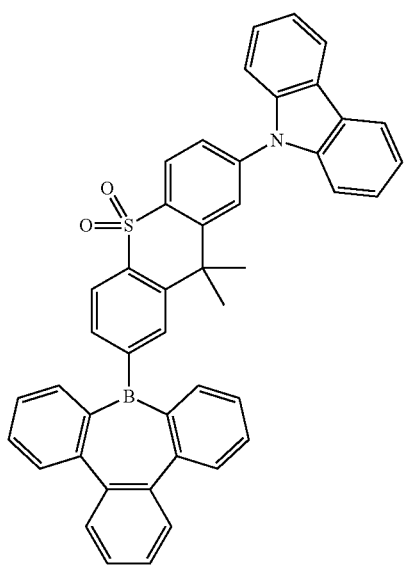
11
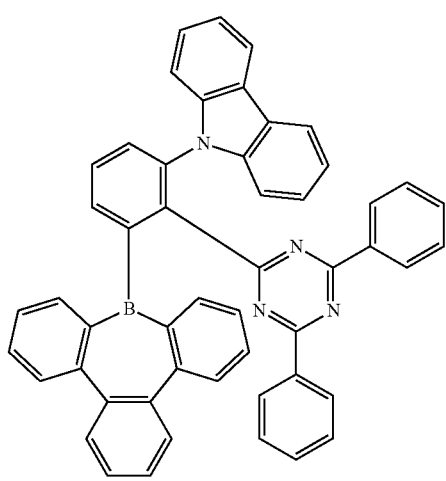
8
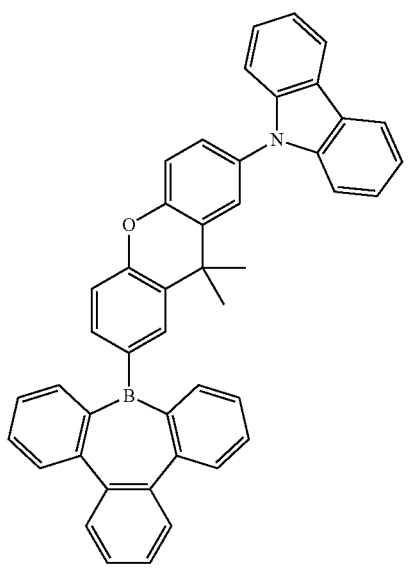
12
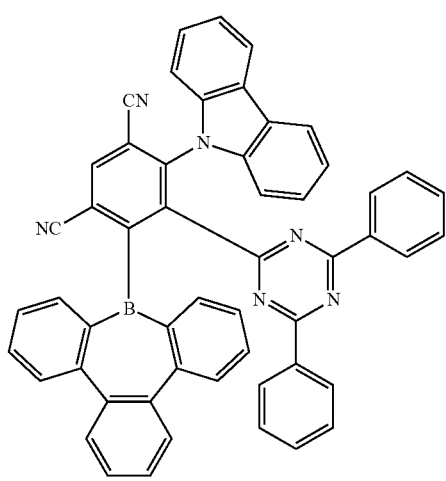

13
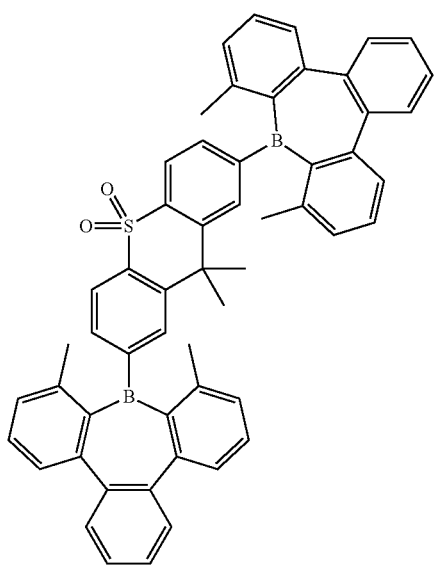
14
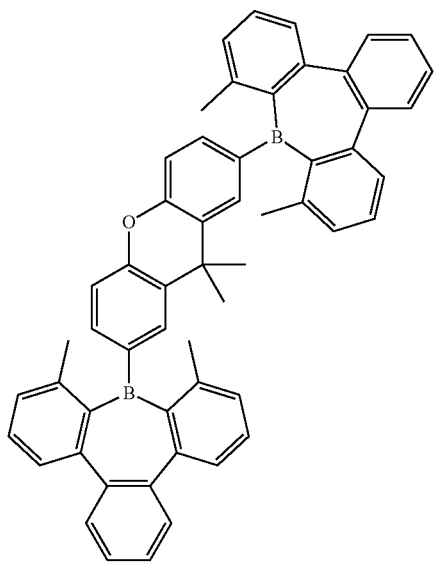
15
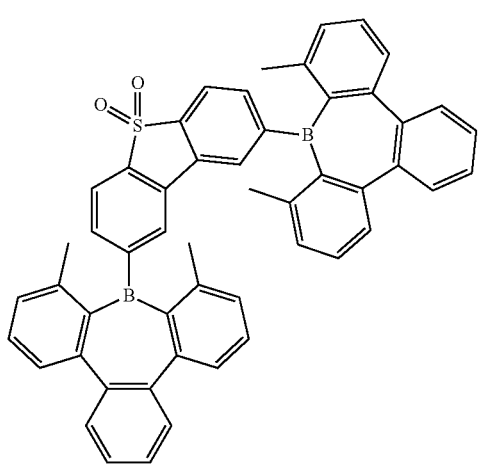
16
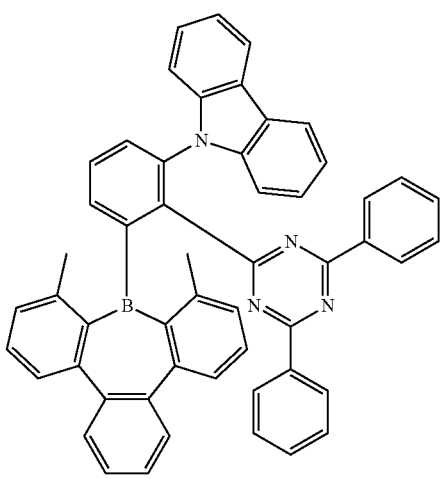
17
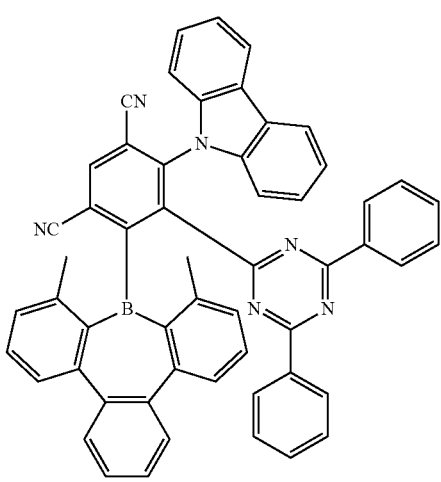
18
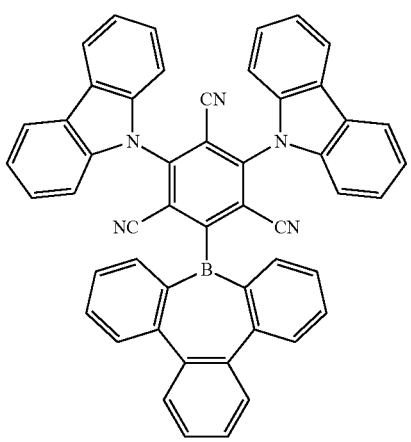

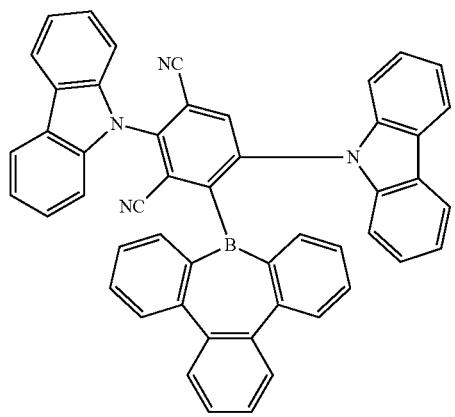
19
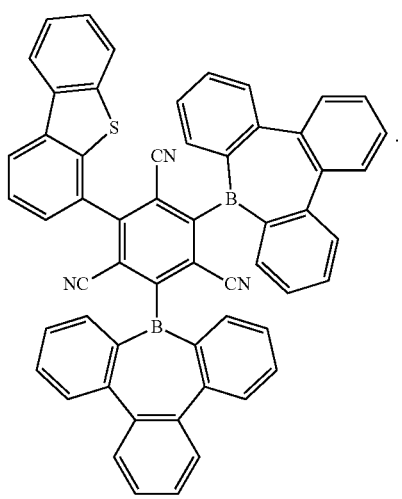
22
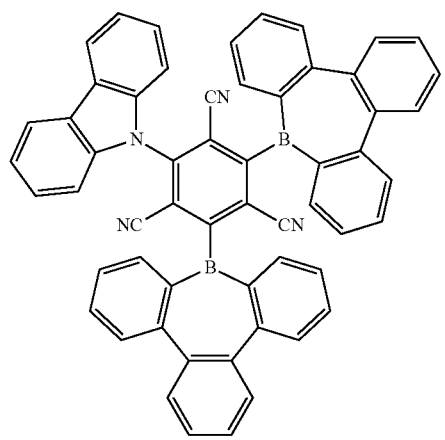
20
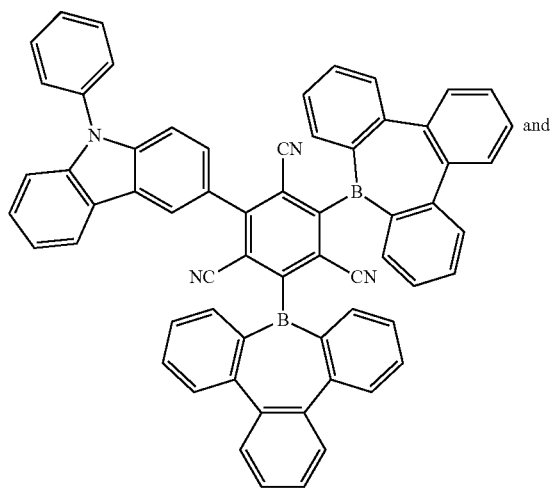
and
21
14. A polycyclic compound represented by the following Formula 1:
[DU1⧾AU⧾DU2]$_m$     [Formula 1]
in Formula 1,
DU1 and DU2 are represented by the following Formula 2-1 or 2-2, and at least one of DU1 or DU2 is represented by the following Formula 2-1,
AU is represented by one of A2 to A7, and
m is 1 or 2:
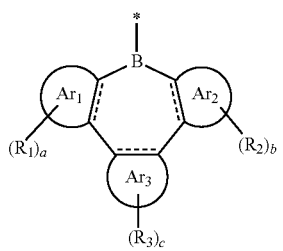
[Formula 2-1]
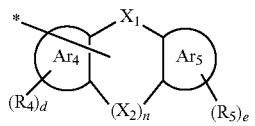
[Formula 2-2]
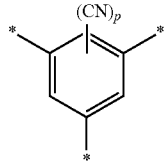
A2

-continued

A3

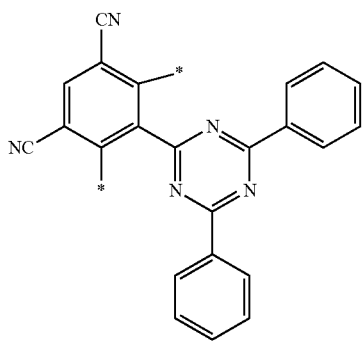

A4

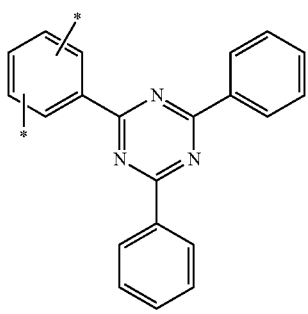

A5

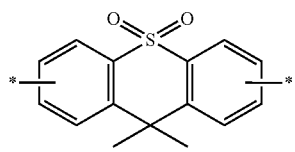

A6

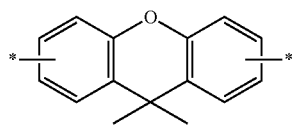

A7

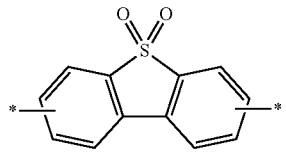

in Formula 2-2,
$X_1$ is N, or $NR_a$,
$X_2$ is a direct linkage, $CR_bR_c$, or $(CR_d)=(CR_e)$, and
n is 1 to 2,
in Formulae 2-1 and 2-2,
Ar$_1$ to Ar$_5$ are each independently a hydrocarbon ring having 5 to 60 carbon atoms for forming a ring, or a heterocycle having 5 to 60 carbon atoms for forming a ring which comprises no nitrogen atom for forming a ring,
a to e are each independently an integer of 0 to 4, and
$R_1$ to $R_5$ and $R_a$ to $R_e$ are each independently a hydrogen atom, a deuterium atom, a halogen atom, an alkyl group having 1 to 10 carbon atoms, a substituted or unsubstituted aryl group having 6 to 30 carbon atoms for forming a ring, or a substituted or unsubstituted heteroaryl group having 5 to 30 carbon atoms for forming a ring, and
in A2 to A7,
p is an integer of 1 to 3.

15. The polycyclic compound of claim 14, wherein Formula 1 is represented by the following Formula 1-1:

[Formula 1-1]

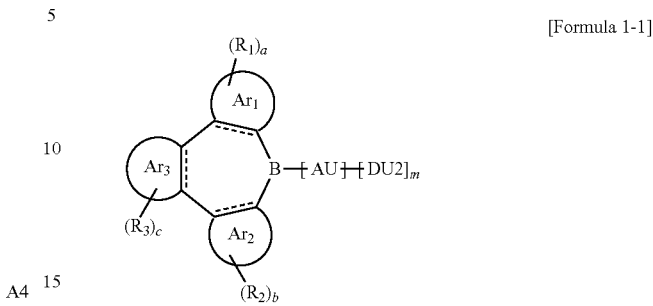

in Formula 1-1,
AU, DU2, and m are the same as defined in Formula 1, and Ar$_1$ to Ar$_3$, R$_1$ to R$_3$, and a to c are the same as defined in Formula 2-1.

16. The polycyclic compound of claim 15, wherein DU2 is represented by any one of the following D1 to D3:

D1

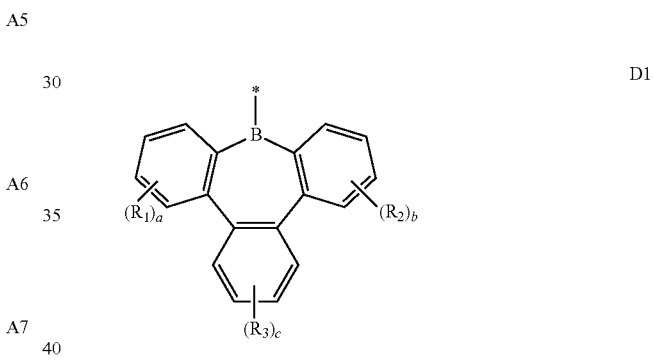

D2

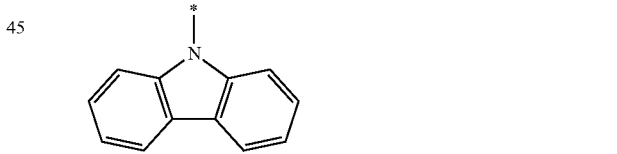

D3

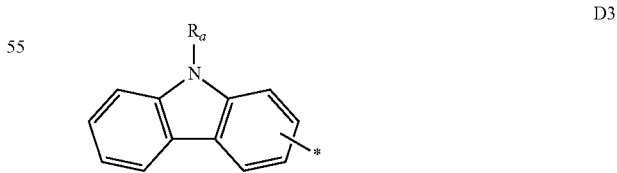

in D1 to D3,
R$_1$ to R$_3$, a to c, and R$_a$ are the same as defined in Formulae 2-1 and 2-2.

17. The polycyclic compound of claim 14, wherein Formula 2-1 is represented by the following Formula 2-1A:

[Formula 2-1A]

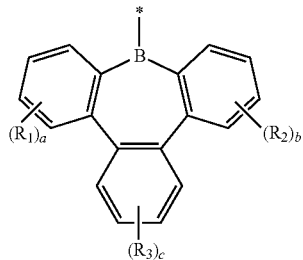

in Formula 2-1A,

R$_1$ to R$_3$, and a to c are the same as defined in Formula 2-1.

18. The polycyclic compound of claim 14, wherein Formula 2-2 is represented by the following Formula 2-2 A or 2-2B:

[Formula 2-2A]

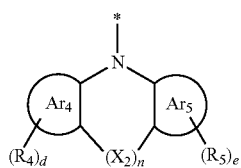

[Formula 2-2B]

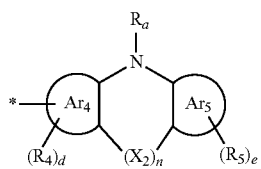

in Formulae 2-2A and 2-2B,

Ar$_4$, Ar$_5$, R$_4$, R$_5$, d, e, X$_2$, n, and R$_a$ are the same as defined in Formula 2-2.

19. The polycyclic compound of claim 14, wherein Ar$_1$ to Ar$_3$ are a substituted or unsubstituted benzene ring.

20. The polycyclic compound of claim 14, wherein the polycyclic compound represented by Formula 1 is any one selected from the group consisting of compounds represented in the following Compound Group 1:

1

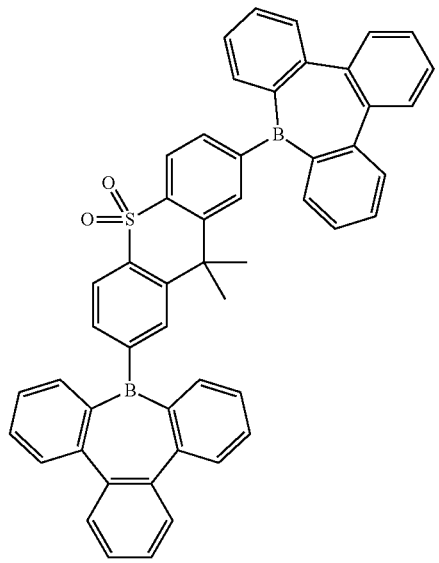

2

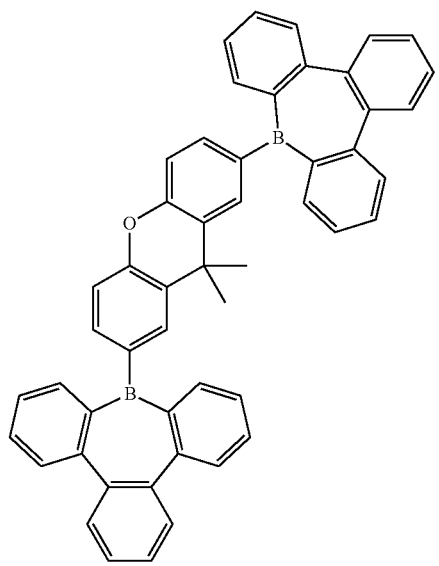

3

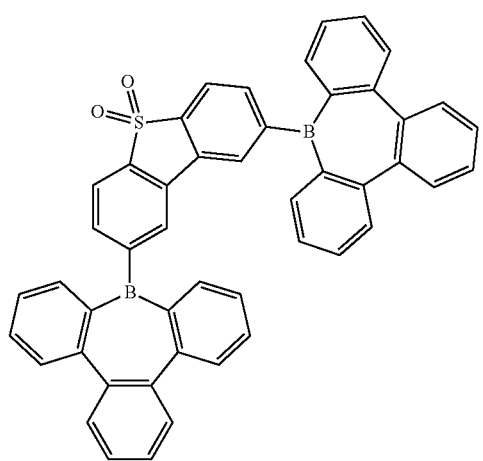

5
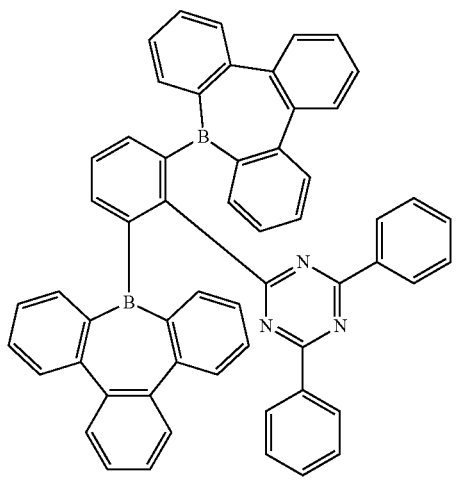
6
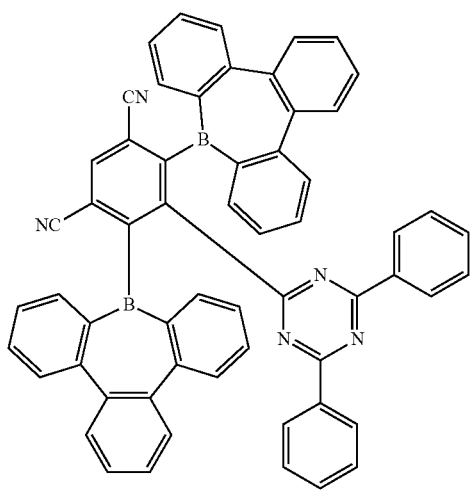
7
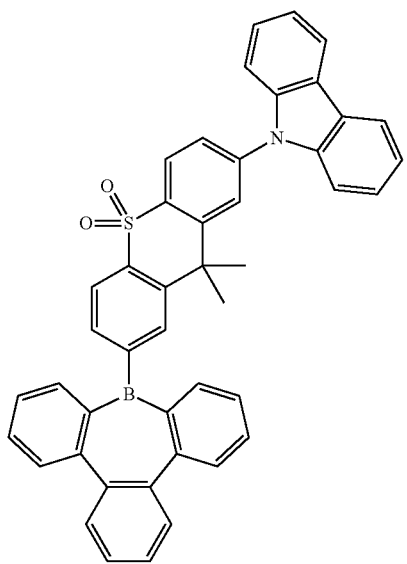
8
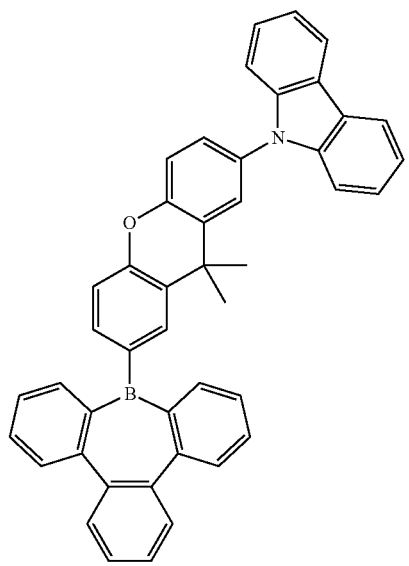
9
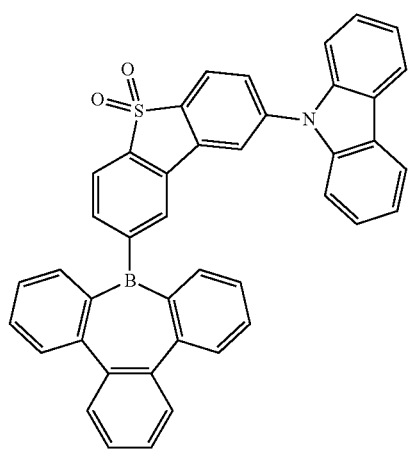
11
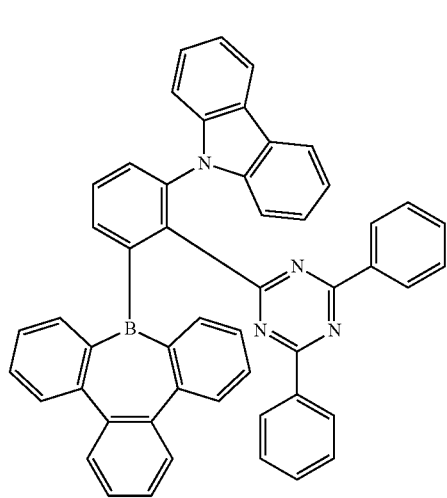

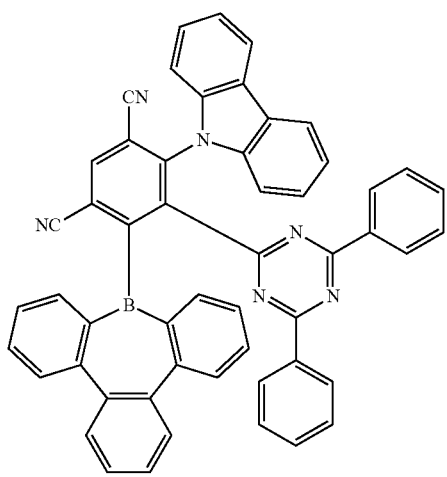
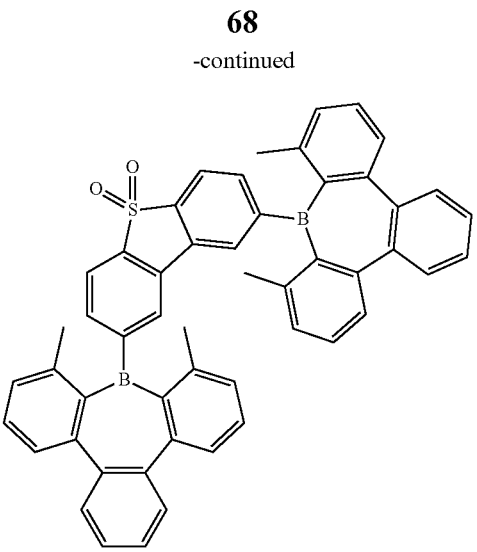
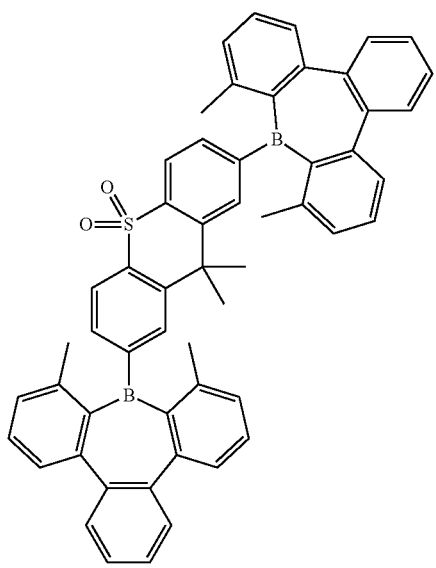
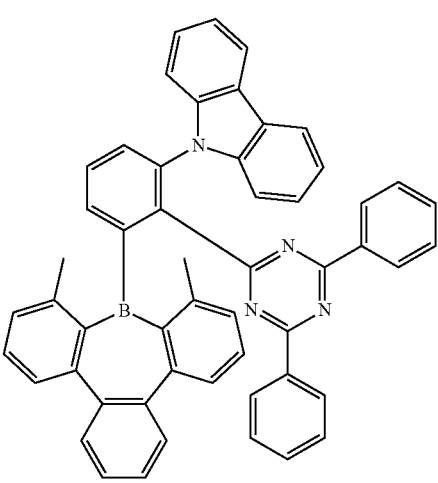
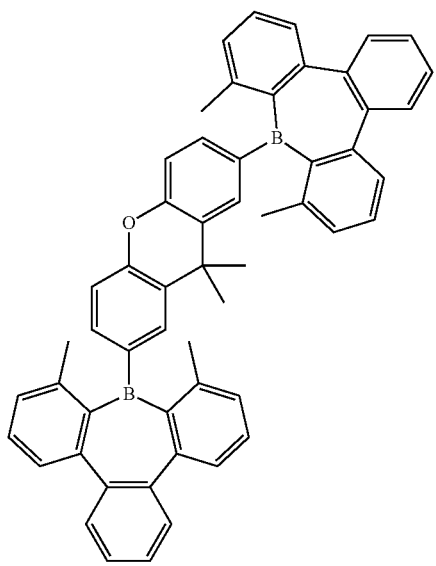
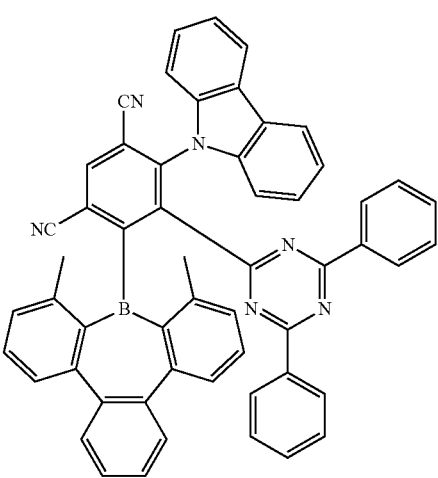

18
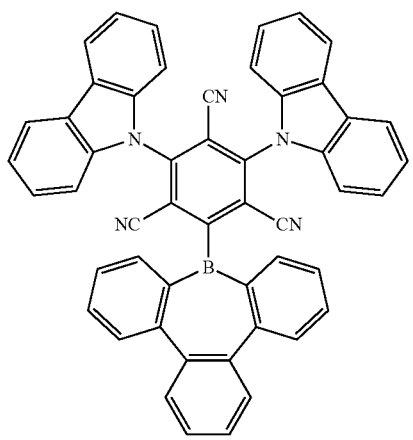
19
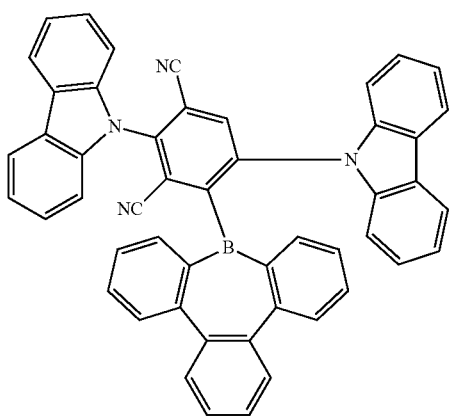
20
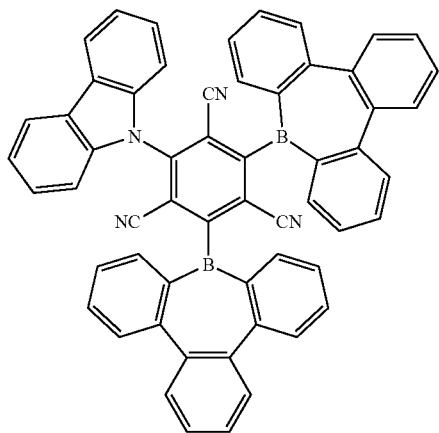
21
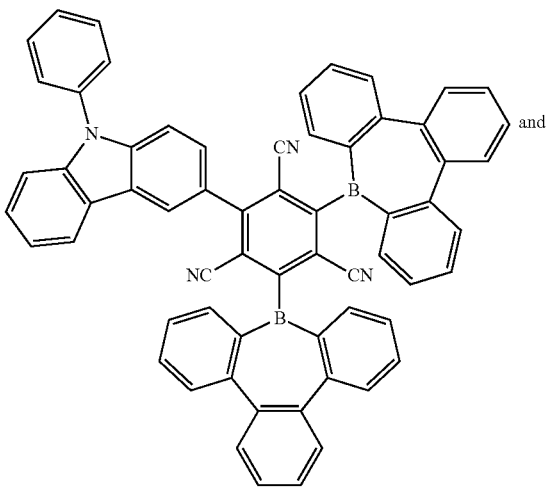
and
22
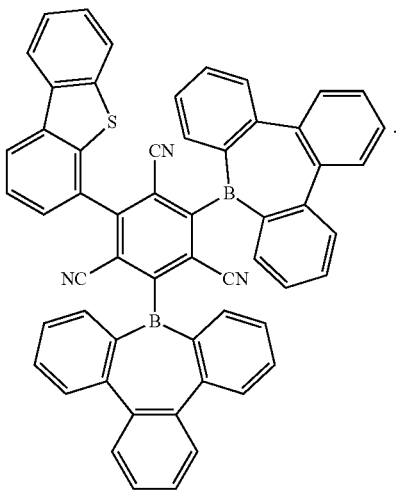
* * * * *